(12) United States Patent
Arai et al.

(10) Patent No.: US 7,813,203 B2
(45) Date of Patent: Oct. 12, 2010

(54) SEMICONDUCTOR MEMORY DEVICE AND METHOD OF MANUFACTURING OF THE SAME

(75) Inventors: Fumitaka Arai, Yokohama (JP); Masaru Kito, Yokohama (JP); Mitsuru Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 311 days.

(21) Appl. No.: 12/039,461

(22) Filed: Feb. 28, 2008

(65) Prior Publication Data

US 2008/0219054 A1  Sep. 11, 2008

(30) Foreign Application Priority Data

Mar. 1, 2007  (JP) ............... 2007-051790

(51) Int. Cl.
  *G11C 7/02* (2006.01)
(52) U.S. Cl. .................... 365/210.15; 365/182.03; 365/185.14; 365/185.17; 365/230.05
(58) Field of Classification Search ............ 365/185.17, 365/210.15, 210, 185.13, 180, 51, 63, 185.2, 365/185.14, 185.03, 230.05
  See application file for complete search history.

(56) References Cited

U.S. PATENT DOCUMENTS 5,590,072 A  12/1996  Choi
5,698,879 A * 12/1997  Aritome et al. ............. 257/315
6,028,788 A  2/2000  Choi et al.
6,954,376 B2  10/2005  Liou
2006/0018181 A1  1/2006  Matsunaga et al.
2007/0036000 A1  2/2007  Kutsukake et al.
2007/0170589 A1* 7/2007  Kato et al. .................. 257/758
2008/0017992 A1  1/2008  Kito et al.
2008/0017996 A1  1/2008  Sato et al.

FOREIGN PATENT DOCUMENTS

AO  8-55920  2/1996

OTHER PUBLICATIONS

U.S. Appl. No. 12/546,885, filed Aug. 25, 2009, Sakaguchi, et al.

* cited by examiner

*Primary Examiner*—Pho M Luu
*Assistant Examiner*—Tha-O Bui
(74) *Attorney, Agent, or Firm*—Oblon, Spivak, McClelland, Maier & Neustadt, L.L.P.

(57) ABSTRACT

A semiconductor memory device includes a plurality of active areas each extending in a first direction and including a memory cell string which includes select transistors and memory cells, current paths of which are connected in series, a first extension portion which is provided between one-side terminal end portions of two active areas neighboring in a second direction that crosses the first direction, and a second extension portion which is provided between other-side terminal end portions of the two active areas neighboring in the second direction, the first and second extension portions connecting the two active areas in a loop configuration.

20 Claims, 34 Drawing Sheets

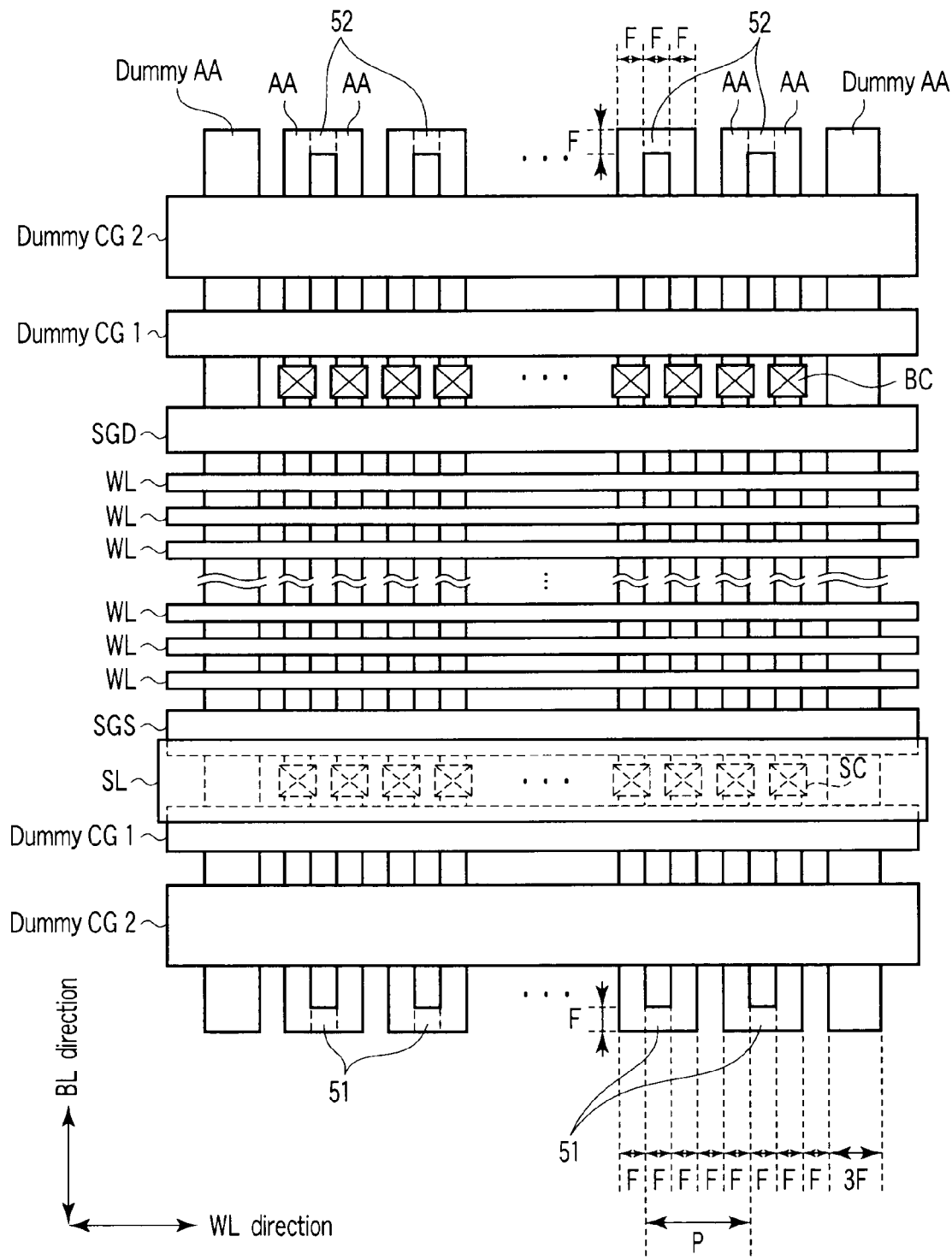
F I G. 2

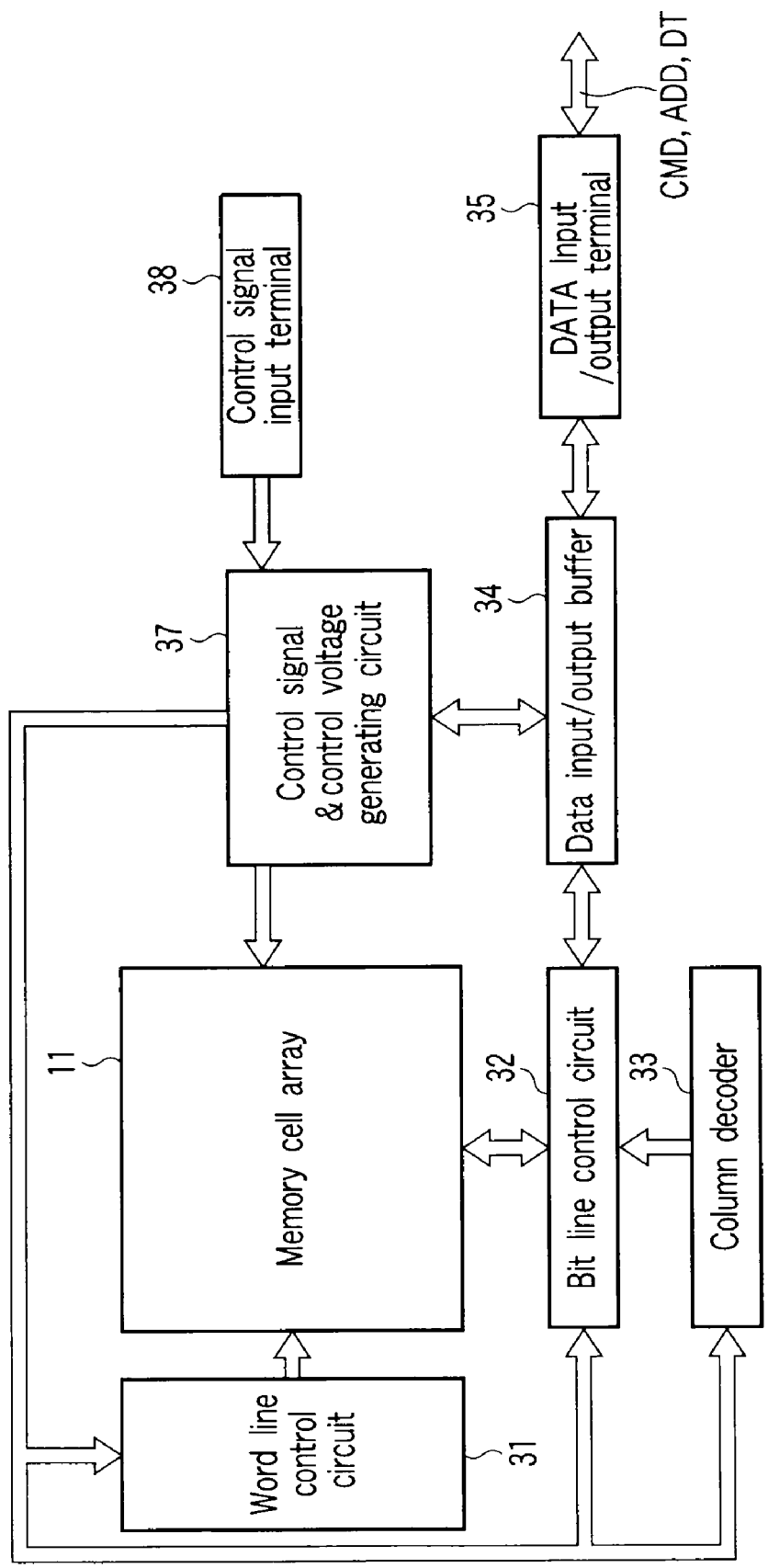
F I G. 8

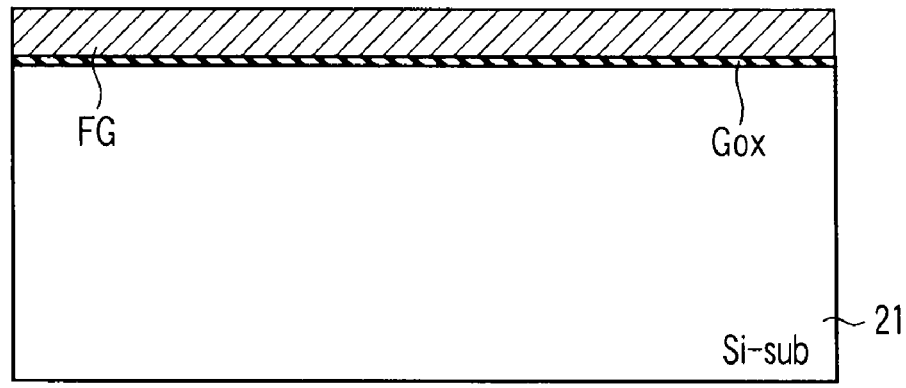
F I G. 10A
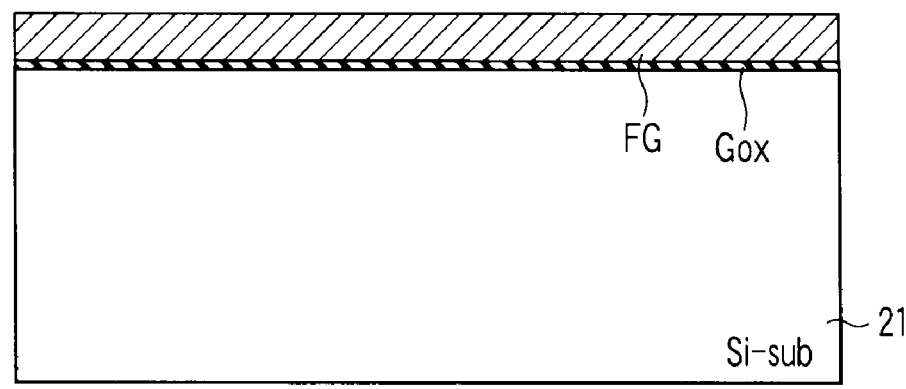
F I G. 10B

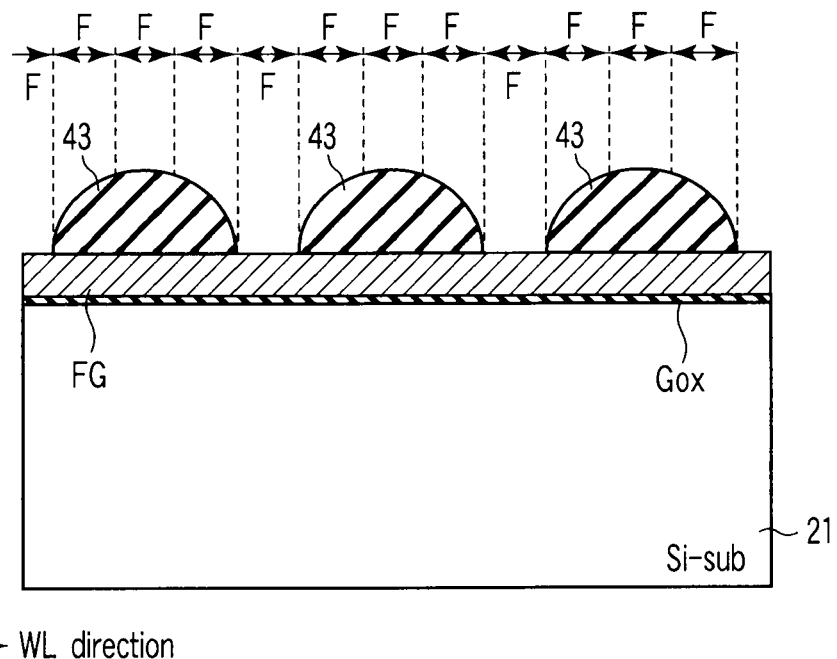
F I G. 12A
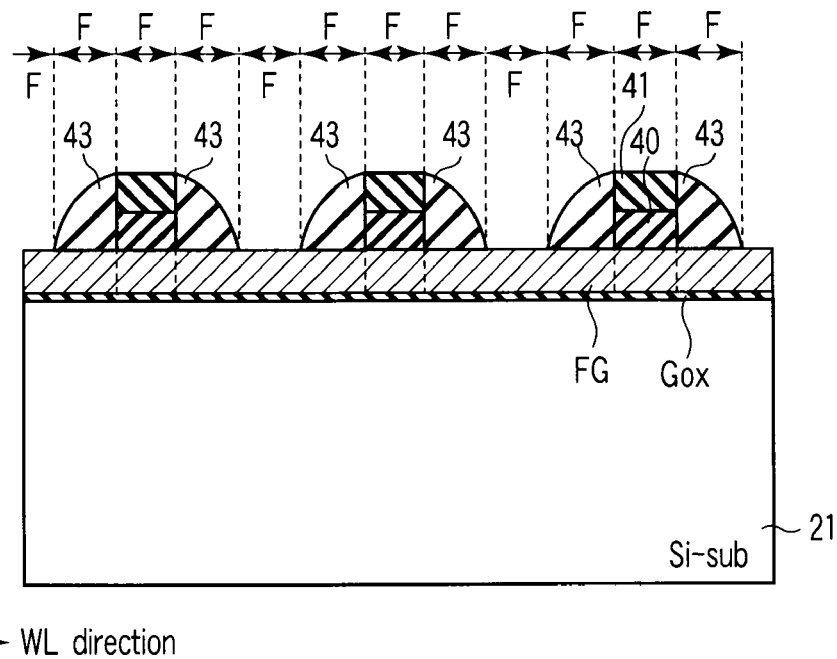
F I G. 12B

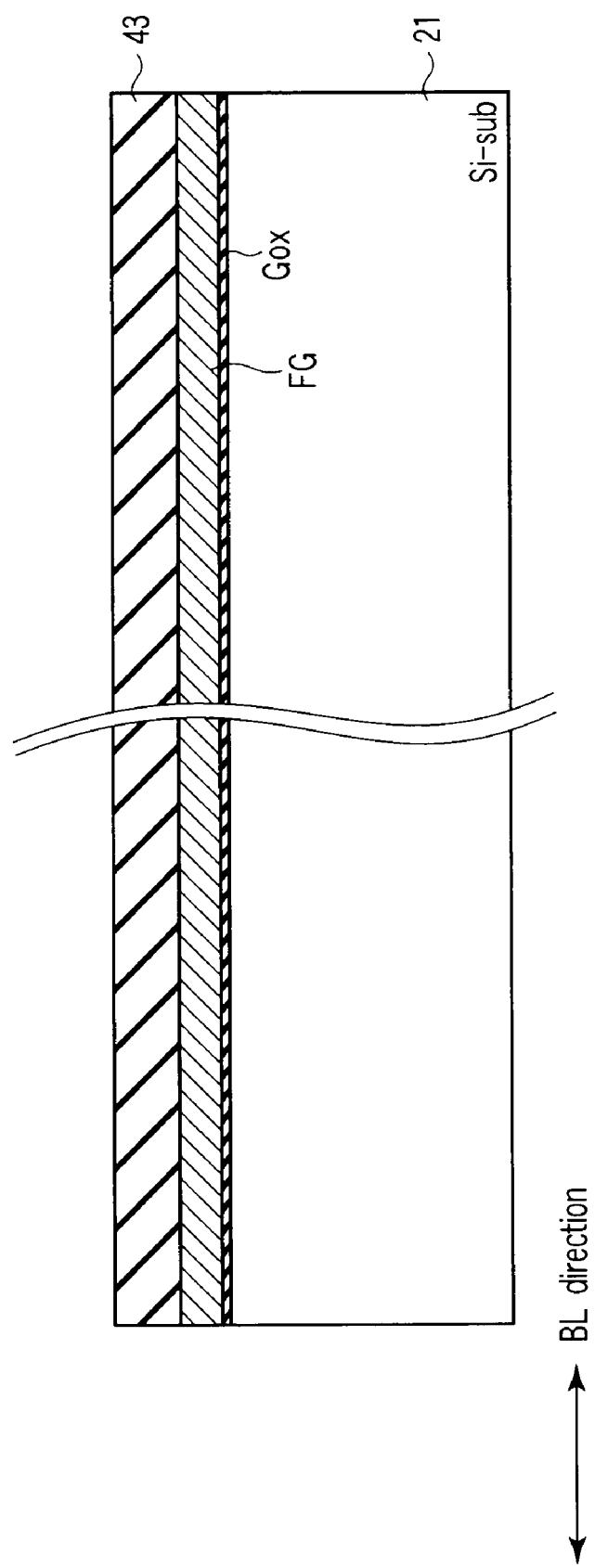
F I G. 12C

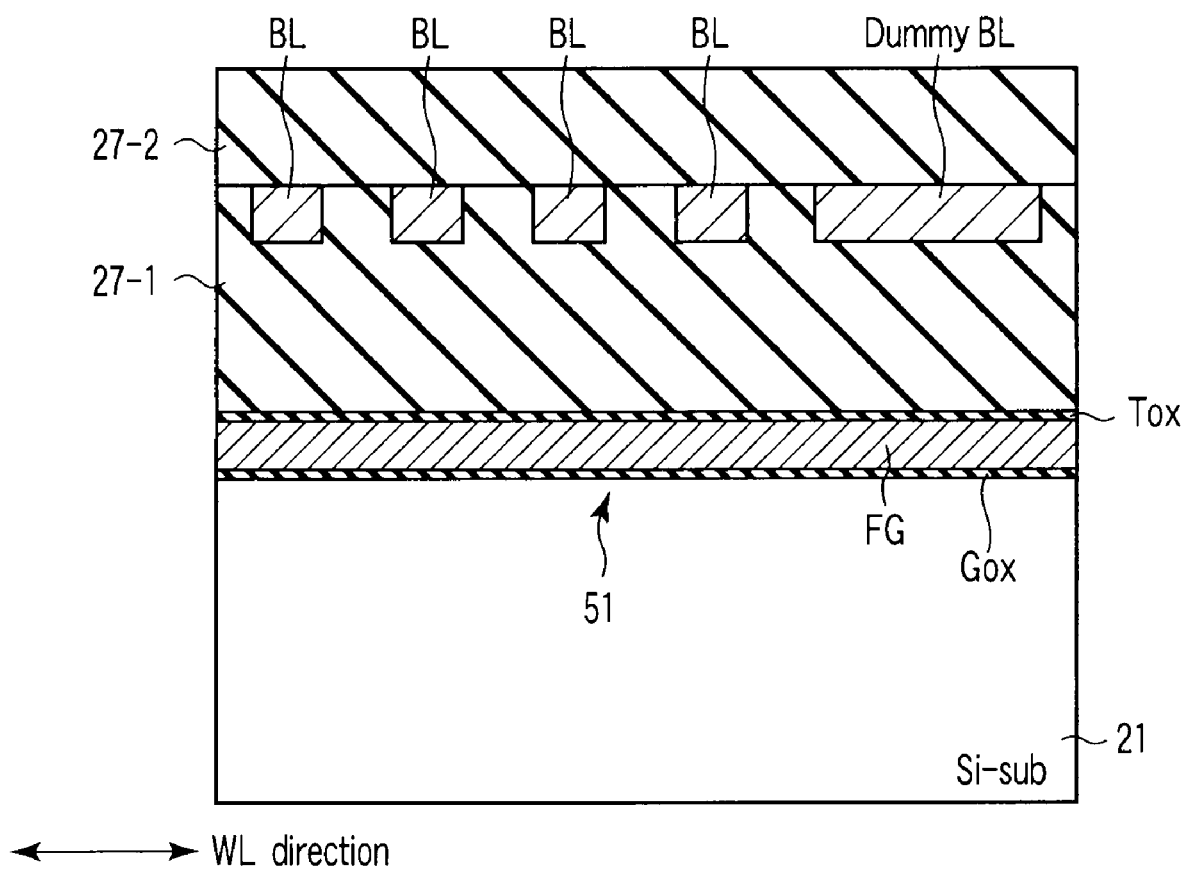
F I G. 19

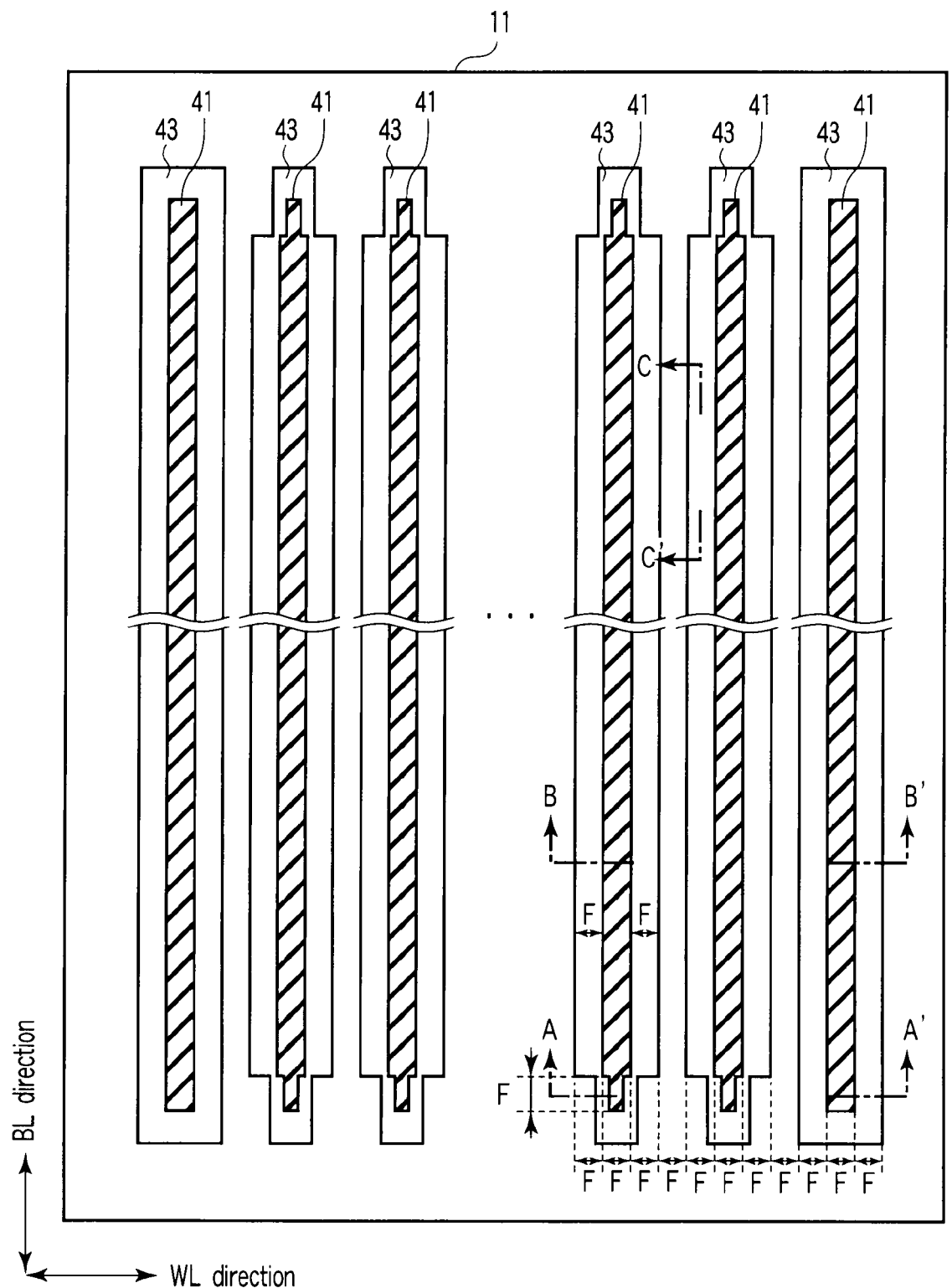
F I G. 24

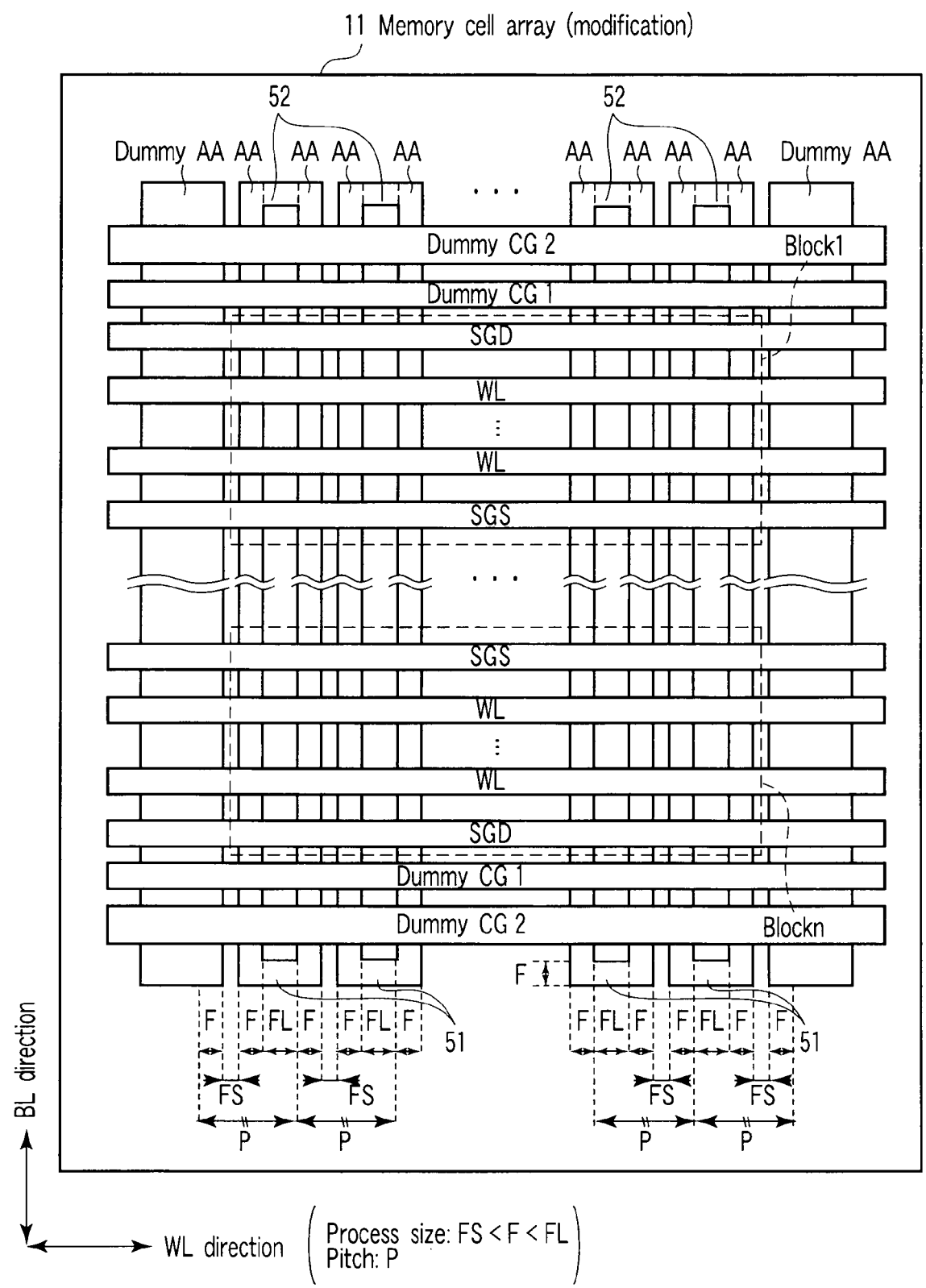
F I G. 27

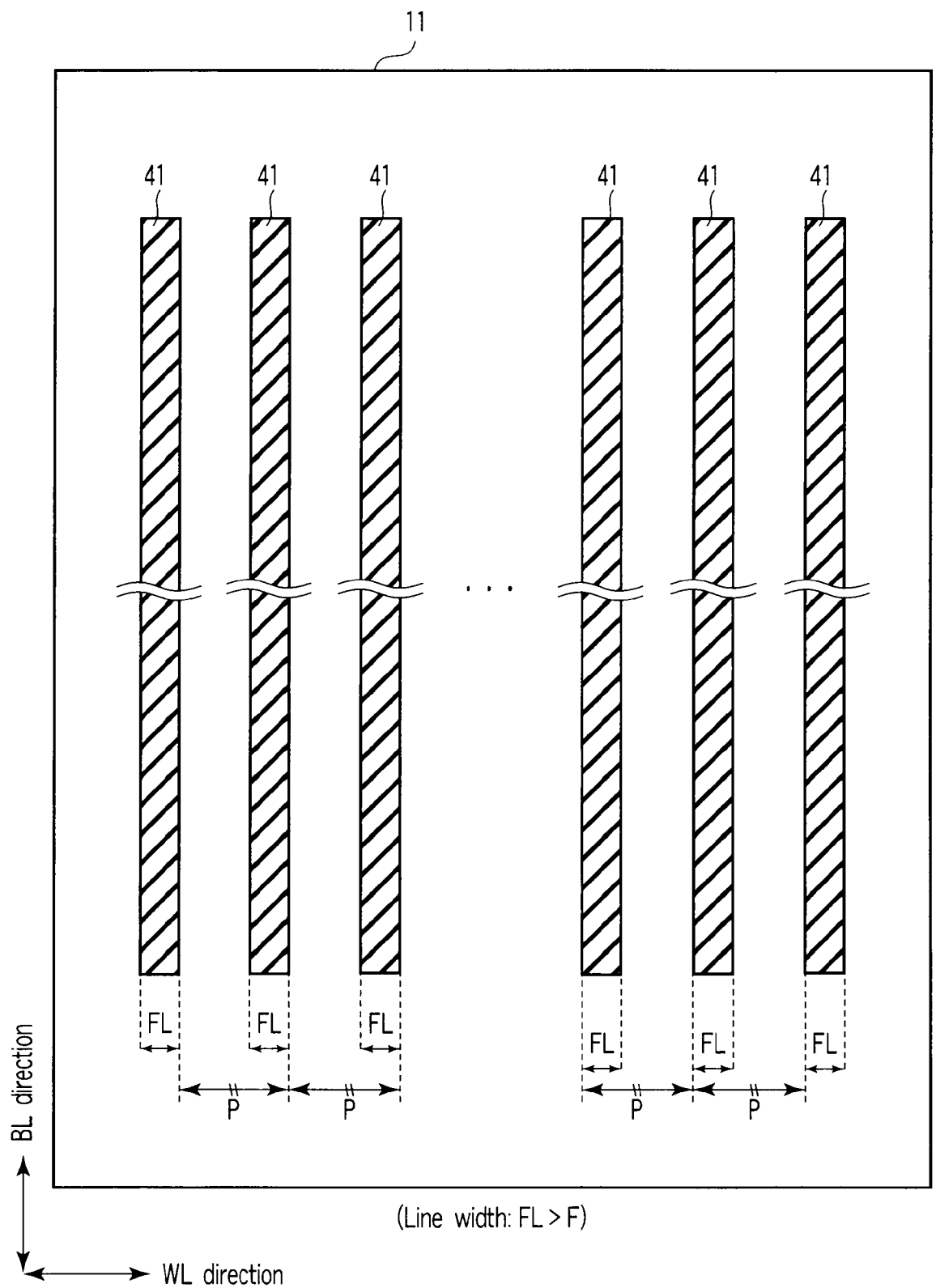
F I G. 28

SEMICONDUCTOR MEMORY DEVICE AND METHOD OF MANUFACTURING OF THE SAME

CROSS-REFERENCE TO RELATED APPLICATIONS

This application is based upon and claims the benefit of priority from prior Japanese Patent Application No. 2007-051790, filed Mar. 1, 2007, the entire contents of which are incorporated herein by reference.

BACKGROUND OF THE INVENTION

1. Field of the Invention

The present invention relates to a semiconductor memory device and a method of manufacturing the semiconductor memory device, and is applied, for example, to a NAND flash memory.

2. Description of the Related Art

Semiconductor memory devices, for instance, NAND flash memories, have recently begun to be used as main memories of various electronic apparatus such as portable audio equipment, by virtue of their features of large capacity and non-volatility (see, e.g. Jpn. Pat. Appln. KOKAI Publication No. H8-55920).

When active areas of the NAND flash memory are to be formed on a semiconductor substrate, each of the active areas is formed with an isolated pattern in a line shape along one direction.

Thus, "tapering" or "cracking" may occur at a one-side terminal end portion and at the other-side terminal end portion of the active area, and, consequently, dust occurs. As a result, a dust defect due to such dust tends to occur. In addition, there is a tendency that the manufacturing yield decreases due to the dust defect.

BRIEF SUMMARY OF THE INVENTION

According to an aspect of the present invention, there is provided a semiconductor memory device comprising: a plurality of active areas each extending in a first direction and including a memory cell string which includes select transistors and memory cells, current paths of which are connected in series; a first extension portion which is provided between one-side terminal end portions of two the active areas neighboring in a second direction that crosses the first direction; and a second extension portion which is provided between other-side terminal end portions of two the active areas neighboring in the second direction, the first and second extension portions connecting the two active areas in a loop configuration.

According to another aspect of the present invention, there is provided a semiconductor memory device comprising: a plurality of loop-shaped active areas arranged in a first direction at predetermined intervals; and a dummy active area arranged to surround the active areas, a width of the dummy active area as defined in the first direction being equal to a width of the loop-shaped active areas as defined in the first direction, wherein the loop-shaped active area includes a first active area and a second active area are provided to extend in a second direction perpendicular to the first direction, each of the first and second active areas comprising memory cell string which includes select transistors and memory cells, current paths of which are connected in series, a first extension portion which is provided in such a manner as to connect one-side end portions of the first and second active areas in the first direction, and a second extension portion which is provided in such a manner as to connect other-side end portions of the first and second active areas in the first direction.

BRIEF DESCRIPTION OF THE SEVERAL VIEWS OF THE DRAWING

FIG. 2 is a plan view showing the semiconductor memory device according to the first embodiment;

FIG. 8 is a circuit diagram showing one block in FIG. 1;

FIG. 10A is a cross-sectional view illustrating a fabrication step of the semiconductor memory device according to the first embodiment;

FIG. 10B is a cross-sectional view illustrating a fabrication step of the semiconductor memory device according to the first embodiment;

FIG. 12A is a cross-sectional view illustrating a fabrication step of the semiconductor memory device according to the first embodiment;

FIG. 12B is a cross-sectional view illustrating a fabrication step of the semiconductor memory device according to the first embodiment;

FIG. 12C is a cross-sectional view illustrating a fabrication step of the semiconductor memory device according to the first embodiment;

FIG. 19 is a cross-sectional view taken along line A-A' in FIG. 17;

FIG. 24 is a plan view illustrating a fabrication step of the semiconductor memory device according to the third embodiment of the present invention;

FIG. 27 is a plan view showing a semiconductor memory device according to a modification of the present invention;

FIG. 28 is a plan view illustrating a fabrication step of the semiconductor memory device according to the modification.

DETAILED DESCRIPTION OF THE INVENTION

Figure 1:
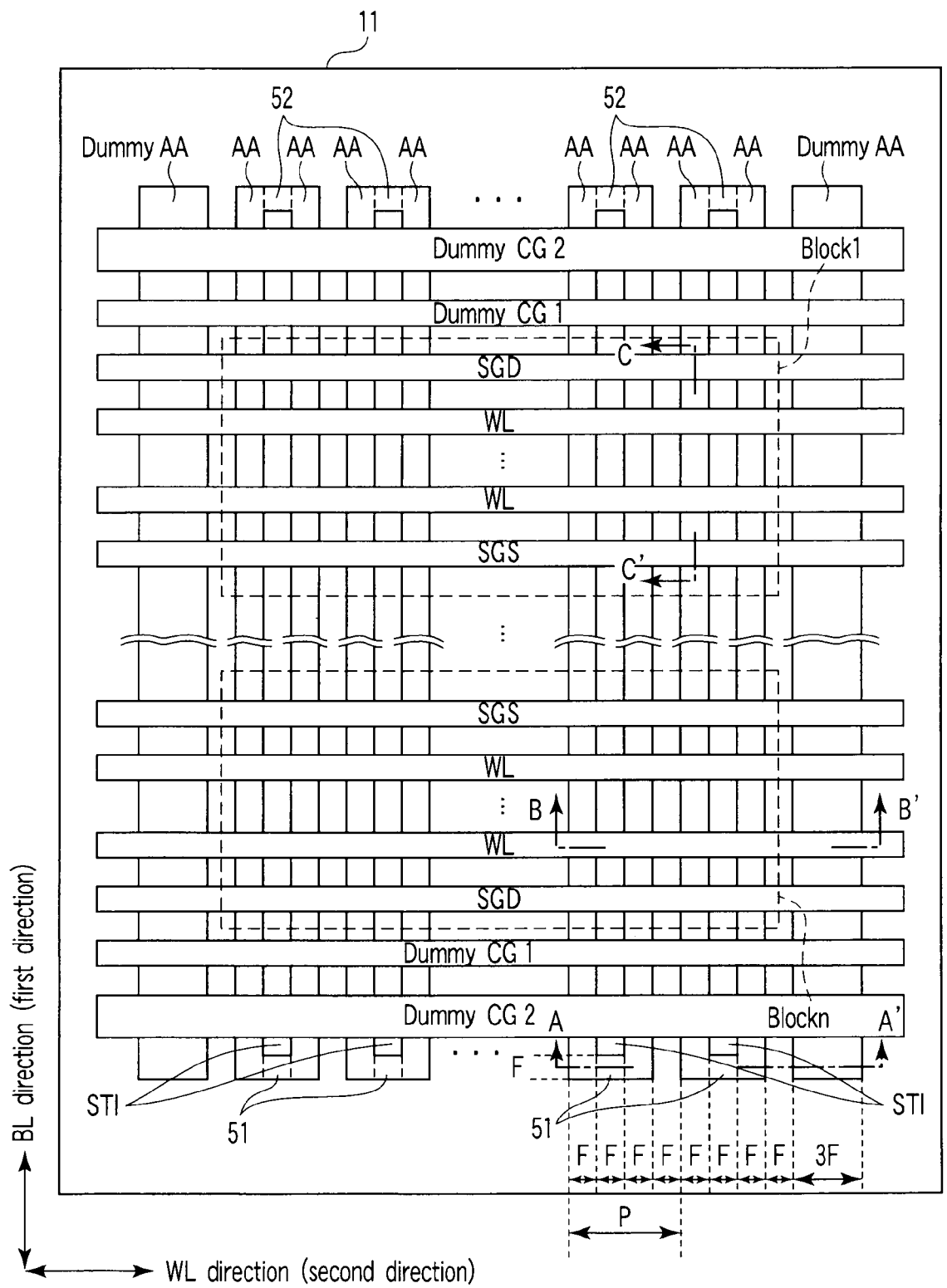
FIG. 1 is a plan view showing a semiconductor memory device according to a first embodiment of the present invention.

Embodiments of the present invention will now be described with reference to the accompanying drawings. In the description below, common parts are denoted by like reference numerals throughout the drawings.

First Embodiment

An Example in which Two Neighboring Active Areas (AA) are Connected in a Loop Shape <1. Example of Plan-View Structure>

Referring to FIG. 1 and FIG. 2, a description is given of an example of a plan-view structure of a memory cell array of a semiconductor memory device according to a first embodiment of the present invention. In this embodiment, a NAND flash memory is exemplified as the semiconductor memory device.

As shown in FIG. 1 and FIG. 2, a memory cell array 11 includes a plurality of active areas AA (Active Areas) which are disposed along a direction of bit lines (BL)("BL direction"), and dummy active areas (dummy AA) which are disposed along the direction of bit lines (BL).

The memory cell array 11 further includes a first extension portion 51 which is provided between one-side terminal end portions of two active areas AA neighboring in a word line (WL) direction ("WL direction") that crosses the BL direction, and a second extension portion 52 which is provided between the other-side terminal end portions of the two active areas AA. The first extension portion 51 and second extension portion 52 connect the two neighboring active areas AA in a loop shape ("loop configuration"). In the description below, the configuration in which a device isolation insulation film STI is surrounded by the active areas AA, first extension portion 51 and second extension portion 52 is referred to as "loop configuration".

The line width of the active area AA in the WL direction is set at about a minimum feature size F. Similarly, the line width of each of the first extension portion 51 and second extension portion 52 in the BL direction is set at about the minimum feature size F. In addition, the line width of the device isolation insulation film STI in the WL direction, which is surrounded by the loop configuration, and the line width of the device isolation insulation film STI, which is located outside the loop configuration and neighbors the loop configuration, are also set at about the minimum feature size.

In short, the size in the WL direction of the active areas AA, the first extension portion 51, the second extension portion 52 and the device isolation insulation films STI is set in such a manner that the pitch P of the loop configuration is equally divided by the minimum feature size F into four parts.

The line width of the dummy active area AA in the WL direction is a sum of the width of an active area AA in the WL direction and the value twice that of the width of the active areas AA adjacent to that active area AA. That is, the line width of the dummy active area AA in the WL direction is about 3 F.

The active area AA includes a memory cell string including select transistors and memory cells in which sources/drains that constitute a current path are connected in series. The memory cells are provided at intersections between the word lines WL and the bit lines BL (not shown) which are disposed on the active area AA. The select transistors are provided at intersections between select gate lines SGS, SGD and the active area AA.

The memory cell array 11 includes a plurality ("n" in this example) of blocks BLOCK1 to BLOCKn. The blocks BLOCK1 to BLOCKn are arranged in the BL direction. Each of the blocks BLOCK1 to BLOCKn is a minimum unit of erasure, that is, a minimum number of memory cells which can be erased at a time.

As shown in FIG. 2, word lines WL extend in a direction perpendicular to the direction in which the active areas AS extend. The word lines WL are arranged at predetermined intervals in the direction of the active areas AA. Select gate lines SGD and SGS are arranged outside the word lines WL.

Bit line contacts BC for electrical connection to the bit lines BL are provided on the active area AA and located outside the select gate line SGD. Although not shown, the bit line contacts BL are shared by two blocks (BLOCK) neighboring in the BL direction.

Source line contacts SC for electrical connection to the source lines are provided on the active area AA and located onside the selective gate line SGS. The source line contacts SC are shared by two blocks (BLOCK) neighboring in the BL direction.

Outside the bit line contacts BL and the source line contacts SC, a dummy CG1 extends in parallel to the select gate lines SGD and SGS. Further, a dummy CG2 extends in parallel to the dummy CG1 in the area outside the dummy CG1. The dummy CG1 and the dummy CG2 are provided in such a manner as to extends over the active areas AA located between dummy AAs.

<2. Structure Example of First and Second Extension Portions>

Figure 3:
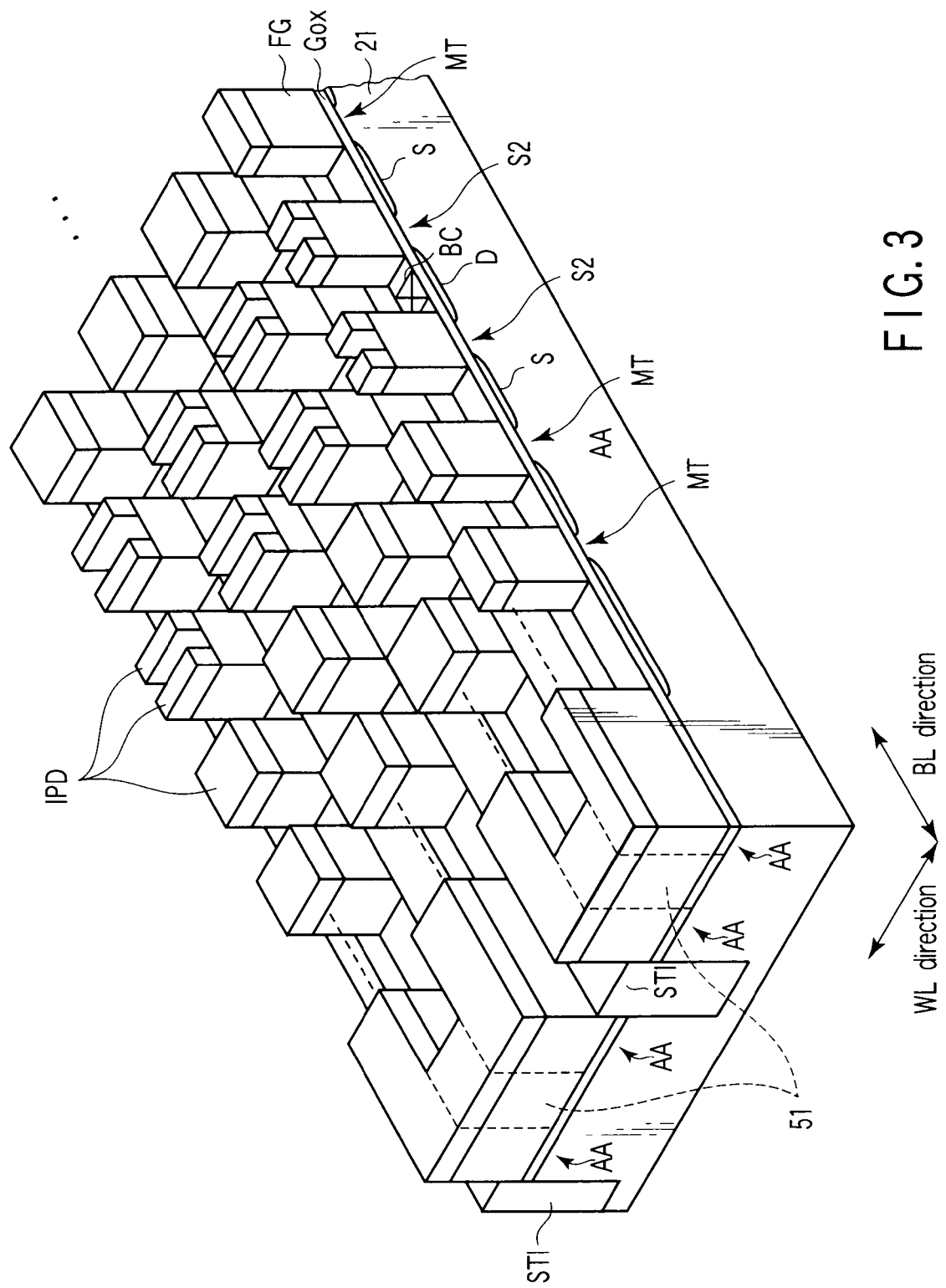
FIG. 3 is a perspective view showing the semiconductor memory device according to the first embodiment.
Figure 4:
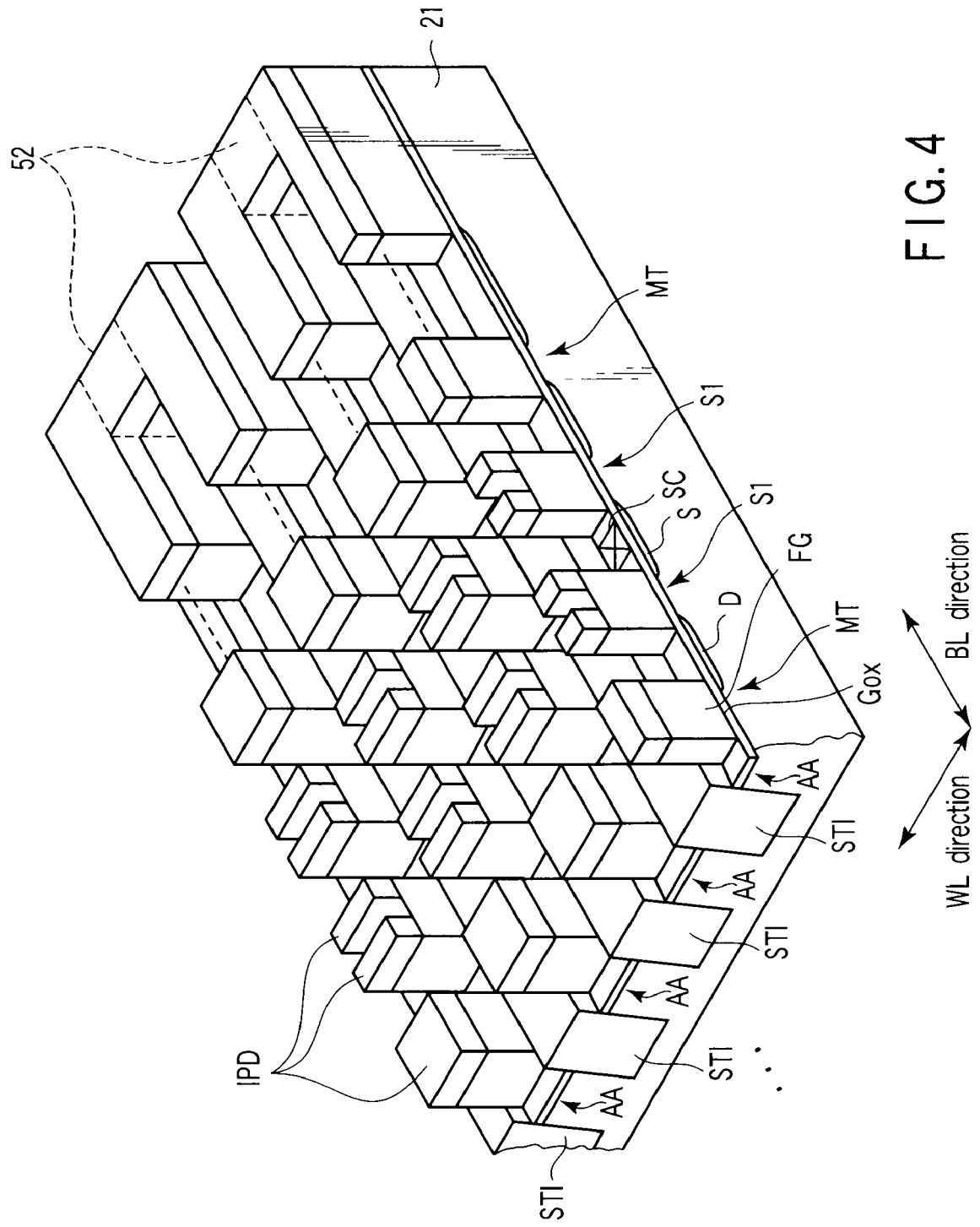
FIG. 4 is a perspective view showing the semiconductor memory device according to the first embodiment.

Next, referring to FIG. 3 and FIG. 4, a description is given of a structure example of the first extension portion 51 and second extension portion 52. For the purpose of description, FIG. 3 and FIG. 4 show a multi-layer structure up to a level of an inter-gate insulation film IPD.

As shown in FIG. 3, the first extension portion 51 is formed to have the same multi-layer structure as the multi-layer structure of the one-side terminal end portion of the active area AA. Specifically, the first extension portion 51 is formed of a tunnel insulation film Gox, a floating electrode FG and inter-gate insulation film IPD, which are successively provided on a semiconductor substrate 21.

Similarly, as shown in FIG. 4, the second extension portion 52 is formed to have the same multi-layer structure as the multi-layer structure of the other-side terminal end portion of the active area AA. Specifically, the second extension portion 52 is formed of a tunnel insulation film Gox, a floating electrode FG and inter-gate insulation film IPD, which are successively provided on the semiconductor substrate 21.

<3. Example of Cross-Sectional Structure>

Figure 5:
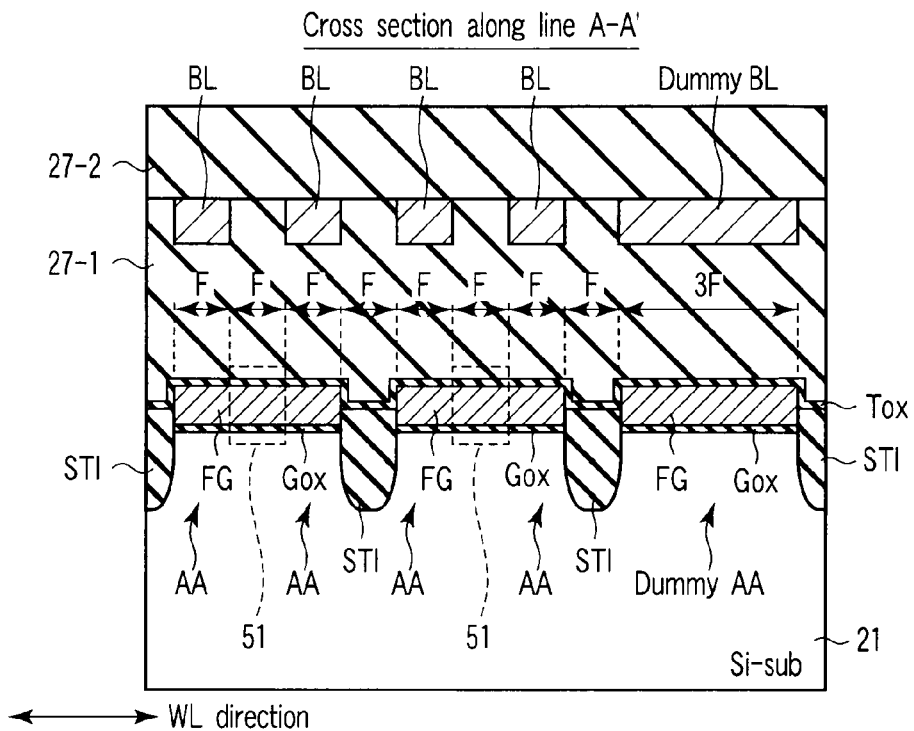
FIG. 5 is a cross-sectional view taken along line A-A' in FIG. 1.
Figure 6:
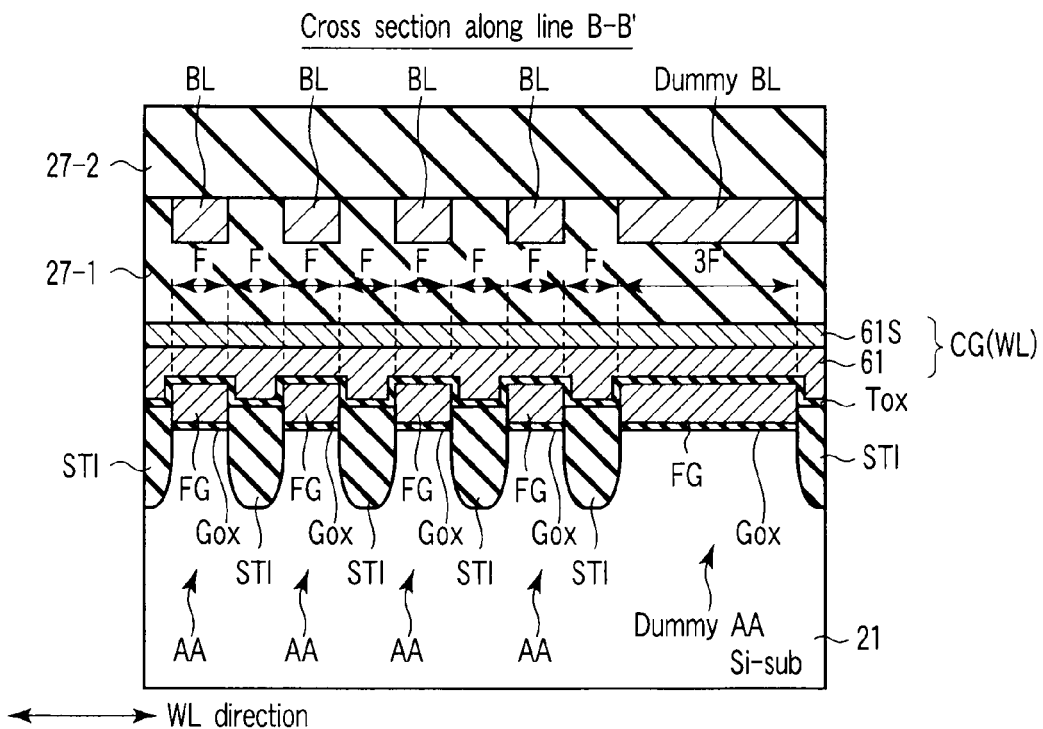
FIG. 6 is a cross-sectional view taken along line B-B' in FIG. 1.
Figure 7:
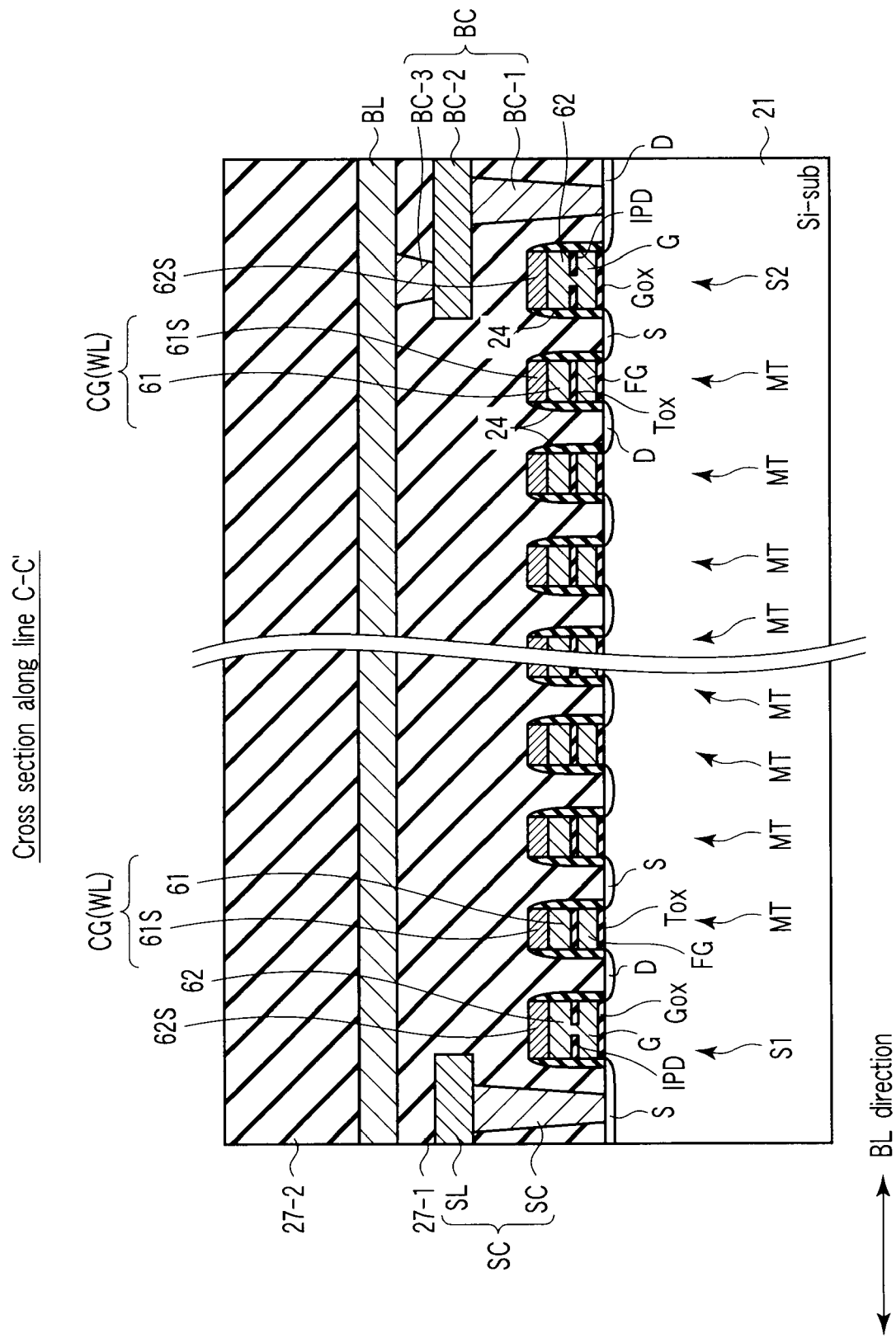
FIG. 7 is a cross-sectional view taken along line C-C' in FIG. 1.

Next, referring to FIG. 5 to FIG. 7, a description is given of an example of the cross-sectional structure of the memory cell array of the semiconductor memory device according to the present embodiment. FIG. 5 is a cross-sectional view taken along line A-A' in FIG. 1, showing one-side terminal end portions of the active areas AA including the first extension portion 51.

As shown in FIG. 5, each active area AA has a multi-layer structure comprising a tunnel insulation film Gox, a floating electrode FG and an inter-gate insulation film Tox (IPD), which are successively formed on the semiconductor substrate 21. The dummy AA has the same multi-layer structure as the active area AA.

Interlayer insulation films 27-1 and 27-2 are provided on the inter-gate insulation film Tox. Bit lines BL are provided in the interlayer insulation film 27-1 at positions above the active areas AA. A dummy bit line is provided in the interlayer insulation film 27-1 at a position above the dummy AA.

FIG. 6 is a cross-sectional view taken along line B-B' in FIG. 1. The cross-sectional structure, which is shown in FIG. 6, differs from the cross-sectional structure shown in FIG. 5 in that the first extension portion 51 and second extension portion 52 are not provided and a control electrode CG (word line WL) comprising a polysilicon layer 61 and a silicide layer 61S is provided.

The polysilicon layer 61 is provided on the inter-gate insulation film Tox along the WL direction. The silicide layer 61S is provided on the polysilicon layer 61 along the WL direction.

FIG. 7 is a cross-sectional view taken along line C-C' in FIG. 1. As shown in FIG. 7, the memory cell string is composed of select transistors S1 and S2 which select the memory cell string, and a plurality of memory cells MT.

Each of the memory cells MT has a MISFET structure which is provided at an intersection between the bit line BL and the word line WL. The source/drain of the memory cell MT, which constitutes a current path, is connected in series to the neighboring memory cell MT. One end of the current path is connected to the bit line BL via the select transistor S2 that is composed of a MISFET, and the other end of the current path is connected to the source line SL via the select transistor S1 that is composed of a MISFET.

Each of the memory cells MT has a multi-layer structure comprising a tunnel insulation film Gox provided on a P-well (not shown) that is formed in the semiconductor substrate 21; a floating electrode FG provided on the tunnel insulation film Gox; an inter-gate insulation film Tox provided on the floating electrode FG; and a control electrode CG (word line WL) provided on the inter-gate insulation film Tox. The control electrode CG is formed of a polysilicon layer 61 and a silicide layer 61S which is provided on the polysilicon layer 61. The floating electrode FG is electrically isolated in each memory cell MT. The control electrodes CG are electrically commonly connected in the memory cells MT in the WL direction.

Each of the memory cells MT includes spacers 24 which are provided along side walls of the multi-layer structure, and a source S and a drain D which are provided in the semiconductor substrate (P-well) 21 so as to sandwich the multi-layer structure.

The select transistor S1, S2 includes a gate insulation film Gox, an inter-gate insulation film IPD and a gate electrode G. The inter-gate insulation film IPD is provided so as to separate a central part of the gate electrode G and to electrically connect upper and lower parts of the gate electrode G. The gate electrode G is formed of a polysilicon layer 62 and a silicide layer 62S that is provided on the polysilicon layer 62.

Each of the select transistors S1 and S2 includes spacers 24 which are provided along side walls of the gate electrode G, and a source S and a drain D which are provided in the semiconductor substrate (P-well) 21 so as to sandwich the gate electrode G.

The bit line BL is electrically connected to the drain D of the select transistor S2 via bit line contacts BC-1 to BC-3 which are provided in the interlayer insulation film 27-1.

The source line SL is electrically connected to the source S of the select transistor S1 via a source line contact SC which is provided in the interlayer insulation film 27-1.

<4. Whole Structure>

Next, the whole structure of the NAND flash memory according to the present embodiment is described with reference to FIG. 8.

As shown in FIG. 8, the NAND flash memory comprises a memory cell array 11, a word line control circuit 31, a bit line control circuit 32, a column decoder 33, a data input/output buffer 34, a data input/output terminal 35, a control signal & control voltage generating circuit 37, and a control signal input terminal 38.

The memory cell array 11 has the above-described structure. The word line control circuit 31 for controlling the word lines and the bit line control circuit 32 for controlling the bit liens are connected to the memory cell array 11.

The word line control circuit 31 selects the word lines in the memory cell array 11, and applies voltages necessary for data read, write or erase to the selected word lines.

The bit line control circuit 32 reads data of memory cells in the memory cell array 11 via the bit lines BL, and detects the states of the memory cells in the memory cell array 11 via the bit lines BL. In addition, the bit line control circuit 32 executes data write in the memory cells by applying write control voltages to the memory cells in the memory cell array 11 via the bit lines BL. The column decoder 33 and the data input/output buffer 34 are connected to the bit line control circuit 32.

Data memory circuits (not shown) are provided in the bit line control circuit 32, and the data memory circuits are selected by the column decoder 33. The data of the memory cells, which are read into the data memory circuits, are output to the outside from the data input/output terminal 35 via the data input/output buffer 34. The data input/output terminal 35 is connected to, for example, a host device which is disposed outside the NAND flash memory.

The host device is, for instance, a microcomputer, which receives data that is output from the data input/output terminal 35. Further, the host device outputs various commands CMD which control the operation of the NAND flash memory, addresses ADD and data DT. Write data, which is input to the data input/output terminal 35 from the host device, is delivered via the data input/output buffer 34 to the data memory circuits (not shown) which are selected by the column decoder 33. On the other hand, the commands and addresses are delivered to the control signal & control voltage generating circuit 37.

The control signal & control voltage generating circuit 37 is connected to the memory cell array 11, bit line control circuit 32, column decoder 33, data input/output buffer 34 and word line control circuit 31. These connected structural circuits are controlled by the control signal & control voltage generating circuit 37. The control signal & control voltage generating circuit 37 is connected to the control signal input terminal 38, and is controlled by control signals, such as an ALE (address latch enable) signal, which are input from the host device via the control signal input terminal 38.

The word line control circuit 31, bit line control circuit 32, column decoder 33 and control signal & control voltage generating circuit 37 constitute a write circuit and a read circuit.

<5. Example of the Structure of the Block>

Figure 9:
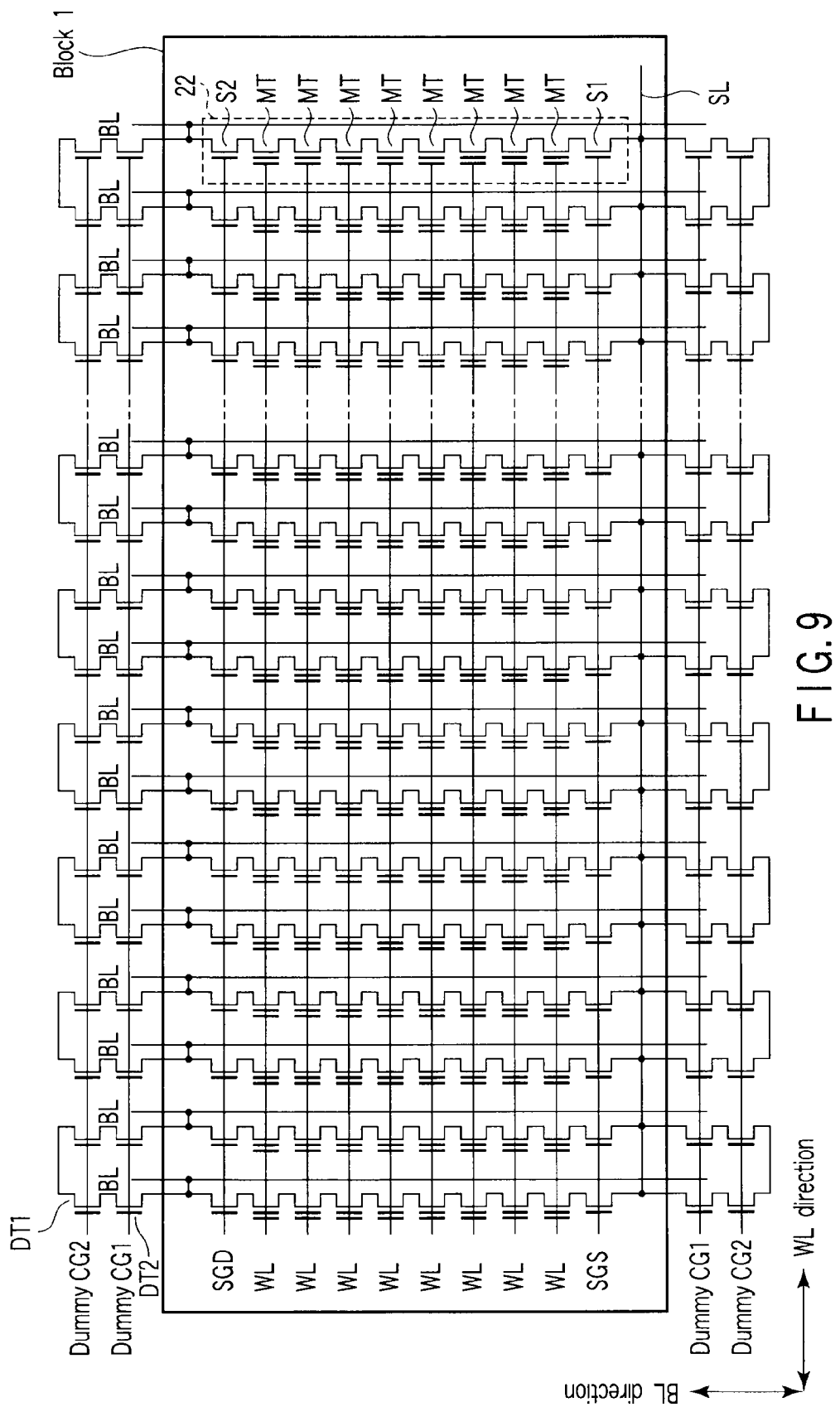
FIG. 9 shows the entirety of the semiconductor memory device according to the first embodiment.

Next, an example of the structure of blocks, which constitute the memory cell array 11, is described with reference to FIG. 9. In this description, one block BLOCK1 is exemplified.

The block BLOCK1 is composed of a plurality of memory cell strings 22 which are arranged in the WL direction. The memory cell string 22 comprises a NAND string, which is composed of eight memory cells MT having series-connected current paths, a select transistor S1 which is connected to one end of the NAND string, and a select transistor S2 which is connected to the other end of the NAND string.

In this example, the NAND string is composed of eight memory cells MT. However, the NAND string may be composed of two or more memory cells, and the number of memory cells is not limited to eight. The select transistor S2 is connected to the bit line BL, and the select transistor S1 is connected to the source line SL.

Word lines WL extend in the WL direction, and are commonly connected to a plurality of memory cells MT which are arranged in the WL direction. A select gate line SGD extends in the WL direction, and is commonly connected to a plurality of select transistors S2 which are arranged in the WL direction. Similarly, a select gate line SGS extends in the WL direction, and is commonly connected to a plurality of select transistors S1 which are arranged in the WL direction.

A dummy CG1, a dummy CG2, and dummy transistors DT1 and DT2 formed at the intersections of the active areas AA, are located outside the select gate lines SGD and SGS. An adjacent NAND string is connected at the first and second extension portions 51 and 52. Now the dummy CG1 or dummy CG2 is applied 0V to turn off dummy transistors DT1 or DT2. Thereby each of the adjacent NAND string can disconnect electrically.

<6. Method of Manufacturing>

Figure 11:
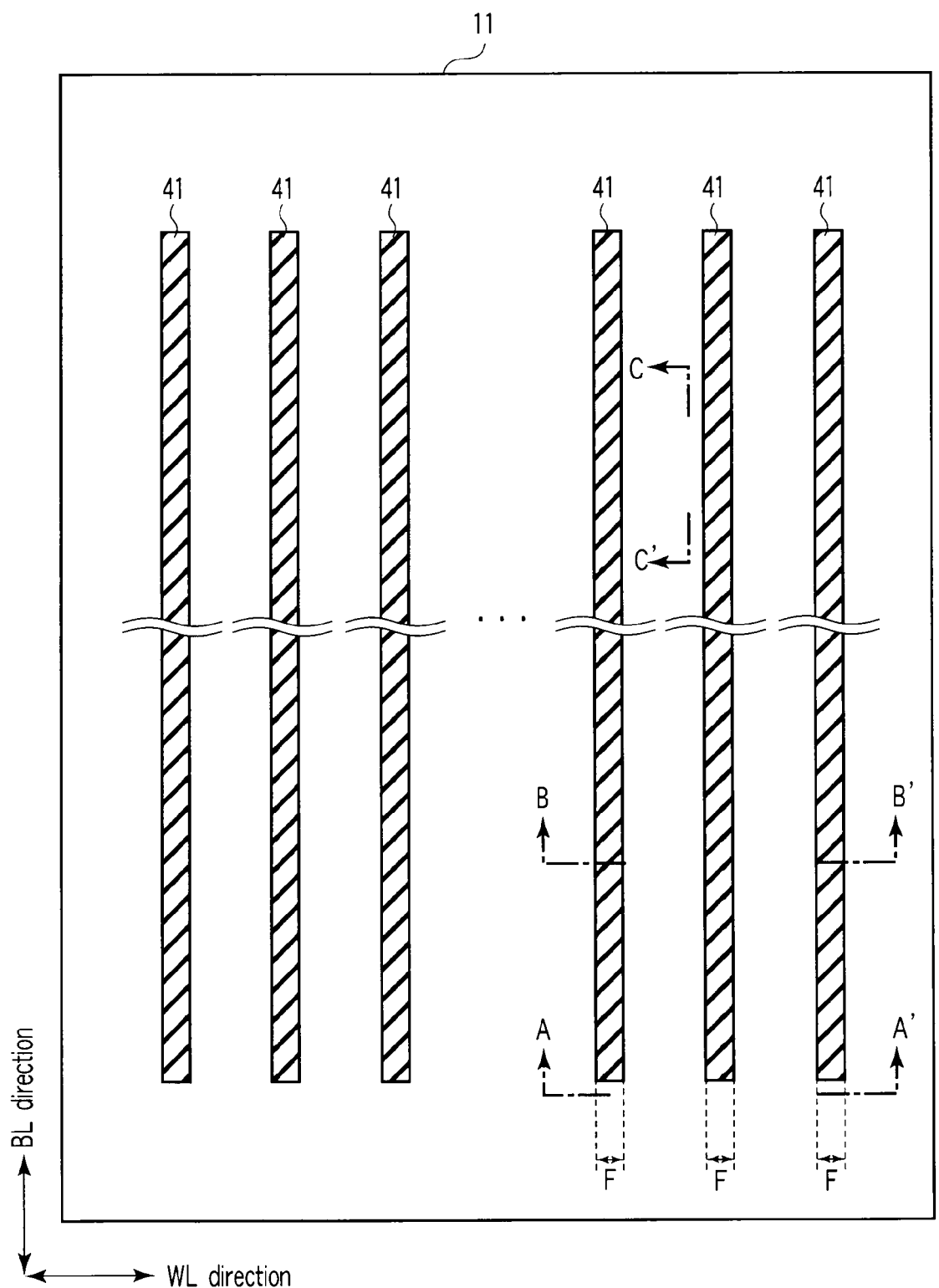
FIG. 11 is a plan view illustrating a fabrication step of the semiconductor memory device according to the first embodiment.
Figure 11A:
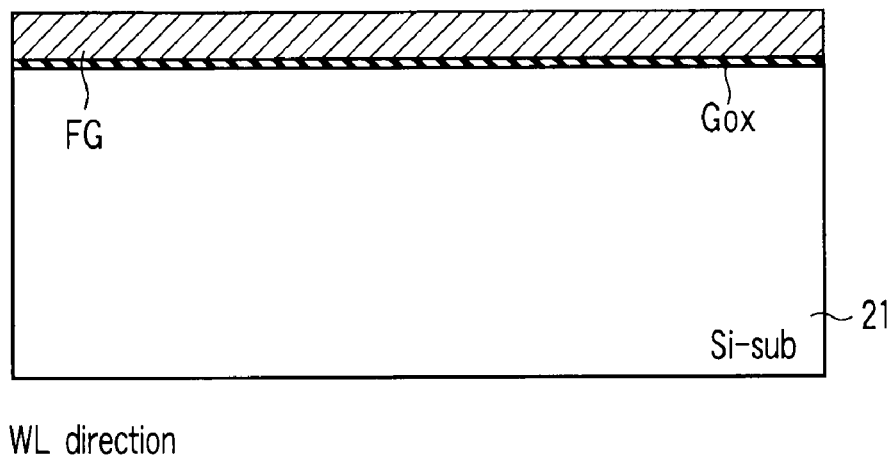
FIG. 11A is a cross-sectional view illustrating a fabrication step of the semiconductor memory device according to the first embodiment.
Figure 11B:
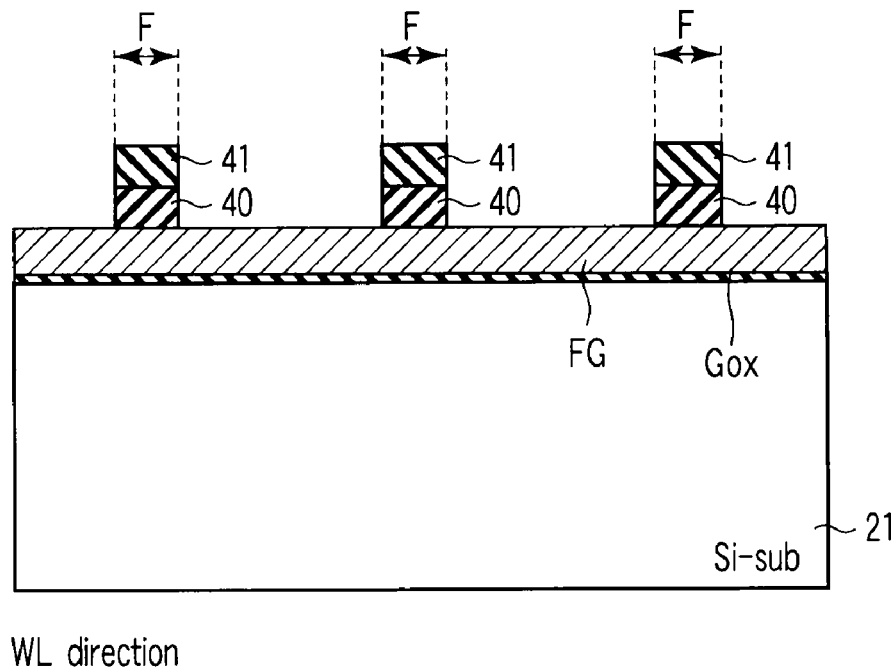
FIG. 11B is a cross-sectional view illustrating a fabrication step of the semiconductor memory device according to the first embodiment.
Figure 11C:
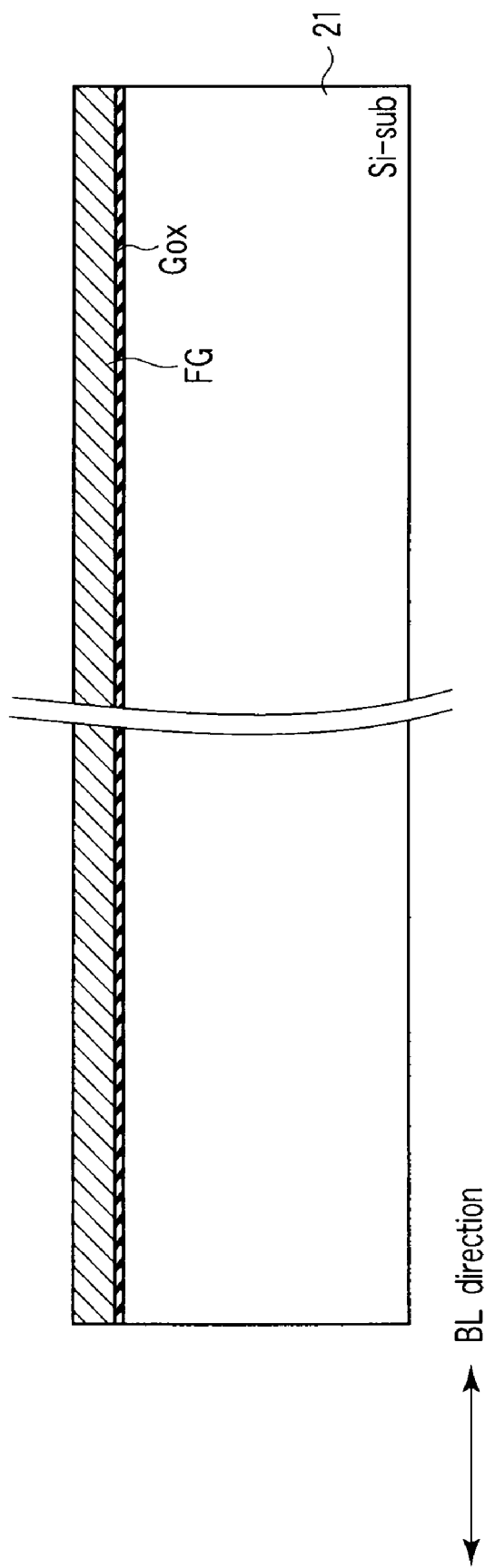
FIG. 11C is a cross-sectional view illustrating a fabrication step of the semiconductor memory device according to the first embodiment.
Figure 12:
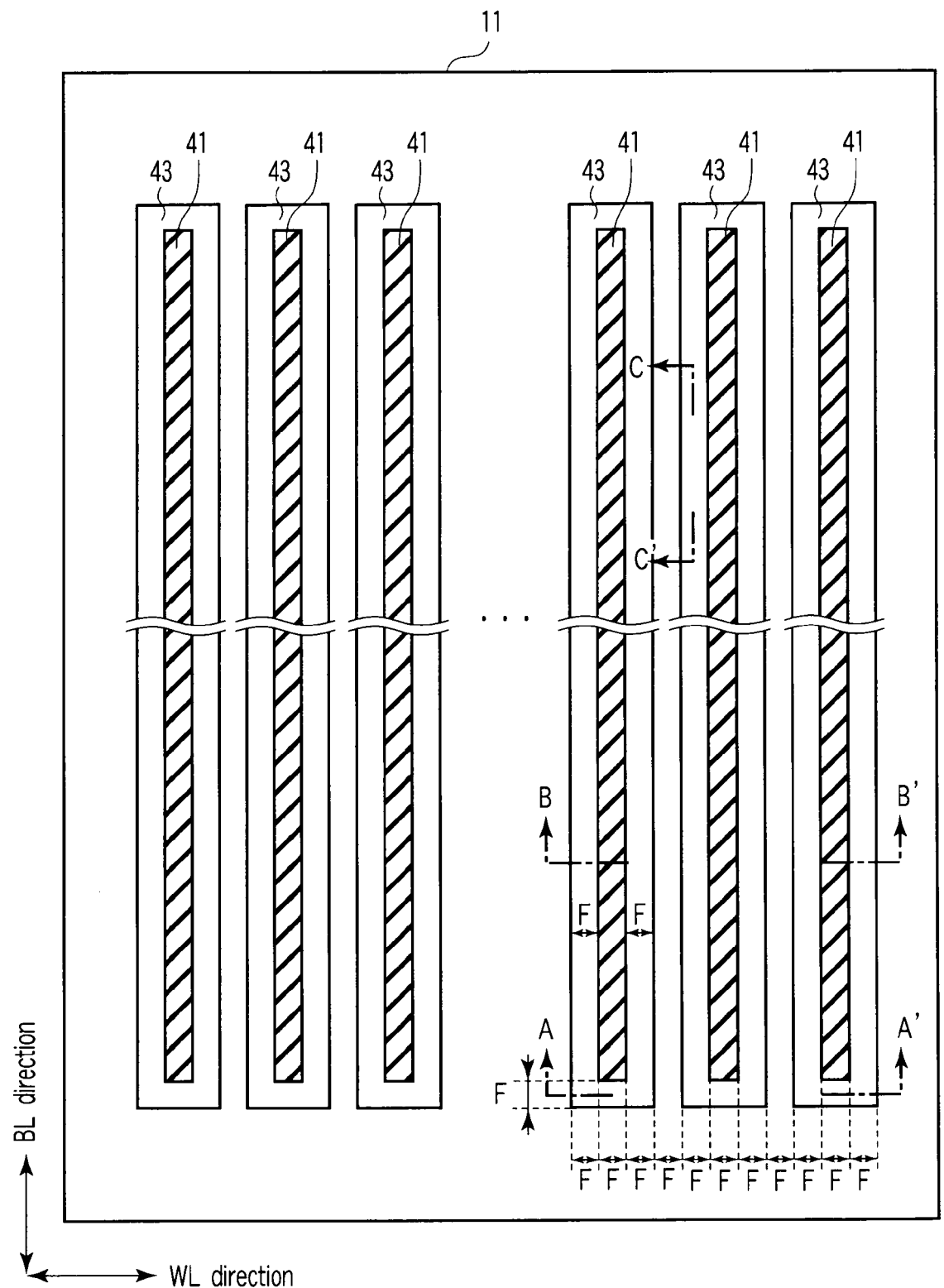
FIG. 12 is a plan view illustrating a fabrication step of the semiconductor memory device according to the first embodiment.
Figure 13:
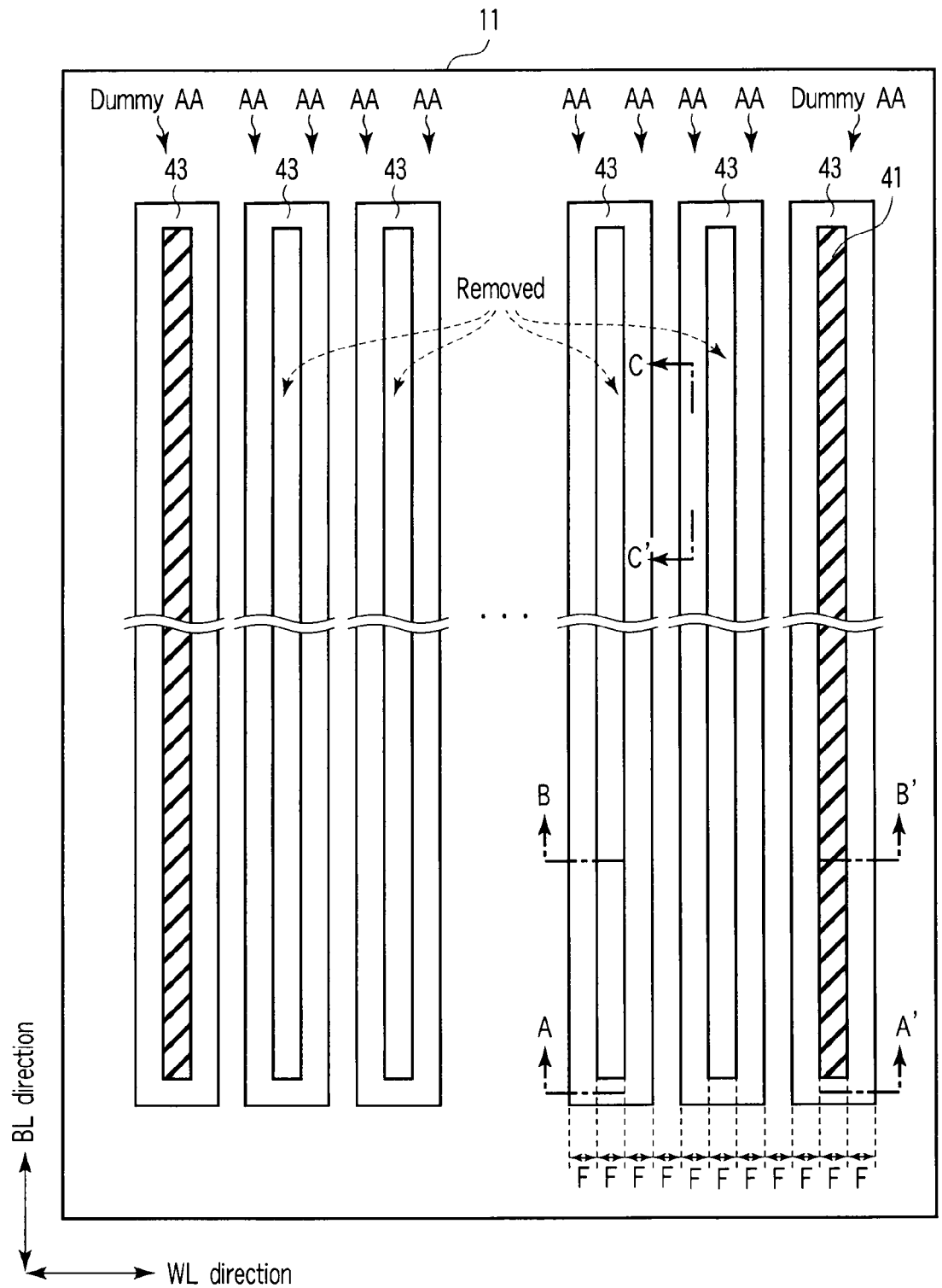
FIG. 13 is a plan view illustrating a fabrication step of the semiconductor memory device according to the first embodiment.

Next, a method of manufacturing the semiconductor memory device according to the present embodiment is described with reference to the accompanying drawings. FIG. 10A to FIG. 16A are cross-sectional views taken along line A-A' in the memory cell array 11 in fabrication steps. FIG. 10B to FIG. 16B are cross-sectional views taken along line B-B' in the memory cell array 11 in fabrication steps. FIG. 10C to FIG. 12C are cross-sectional views taken along line C-C' in the memory cell array 11 in fabrication steps. FIG. 11 to FIG. 13 are plan views showing the memory cell array 11 in fabrication steps.

Although not shown, N-type impurities are doped in a P-type silicon substrate (Si-sub) 21, for example, by an ion implantation method, and an N-type well (n-well) is formed. Then, P-type impurities, such as boron, are doped in the formed N-type well with a concentration of about $10^{14}$ cm$^{-3}$ to $10^{19}$ cm$^{-3}$ by, e.g. ion implantation, and a P-type well (p-well) is formed.

Figure 10C:
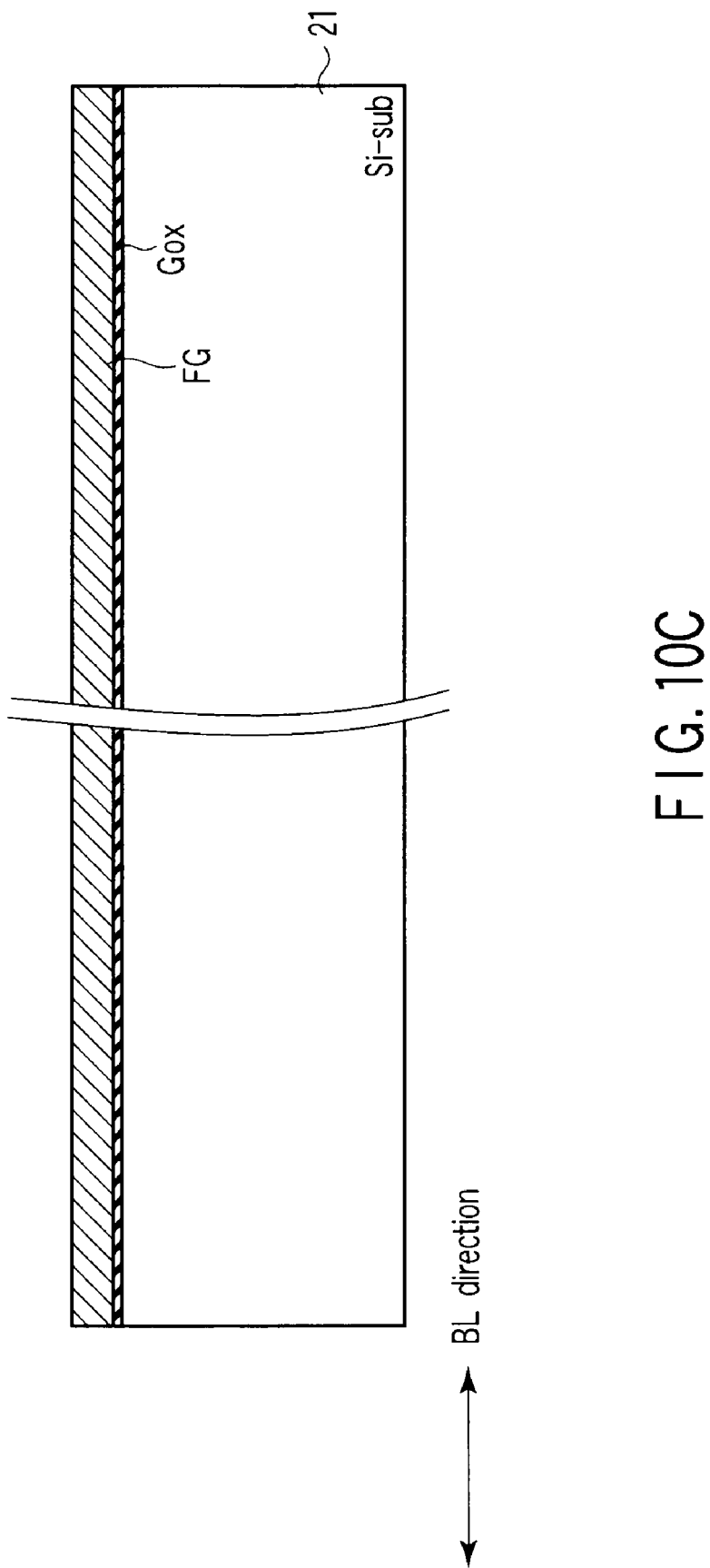
FIG. 10C is a cross-sectional view illustrating a fabrication step of the semiconductor memory device according to the first embodiment.

Subsequently, as shown in FIG. 10A to FIG. 10C, an oxide film is formed on the P-type well by, e.g. a thermal oxidation method, and thus a tunnel insulation film Gox is formed. Then, a polysilicon layer, for instance, is formed on the tunnel insulation film Gox by, e.g. CVD (Chemical Vapor Deposition), and a floating electrode FG is formed.

Then, as shown in FIG. 11 and FIGS. 11A to 11C, mask members 40 and 41 (so-called "cores") are formed by, e.g. CVD and photolithography, on the floating electrode FG along the BL direction. As shown in the Figures, the mask members 40 and 41 are formed of different materials. In this fabrication step, the line widths of the mask materials 40 and 41 in the WL direction are made substantially equal and set at about a minimum feature size F.

Subsequently, as shown in FIG. 12 and FIGS. 12A to 12C, a mask member 43 is formed on the mask members 40 and 41 so as to completely cover the mask members 40 and 41. Then, the mask member 43 is left on only side walls of the mask members 40 and 41 in a self-alignment manner by anisotropic etching such as RIE (Reactive Ion Etching). The width of the mask member 43 formed on the side wall of the mask member 40, 41 is set at about the minimum feature size F.

In this fabrication step, if the anisotropic etching, such as RIE, is further continued (so called "slimming process"), the width of the mask member 43 in the WL direction can be set at less than the minimum feature size F.

Figure 13A:
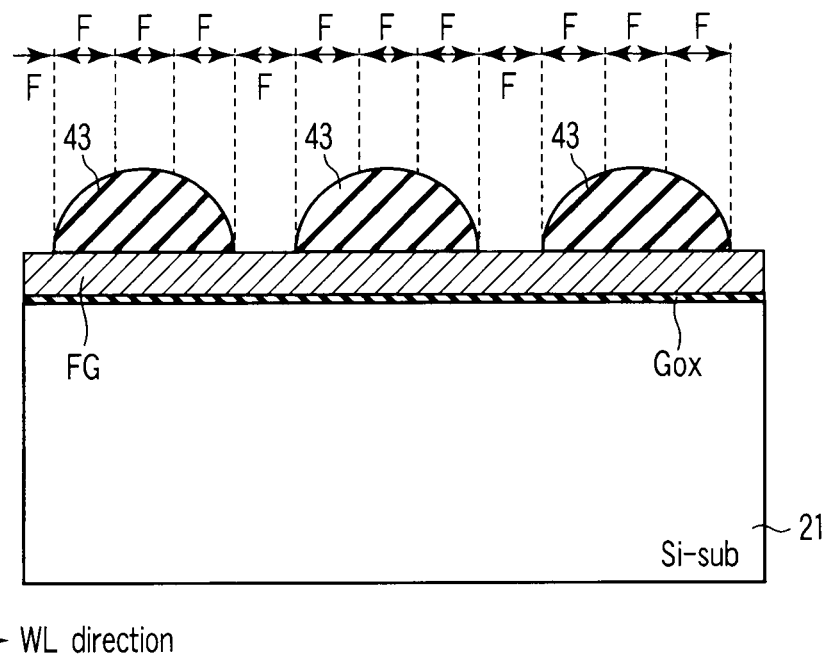
FIG. 13A is a cross-sectional view illustrating a fabrication step of the semiconductor memory device according to the first embodiment.
Figure 13B:
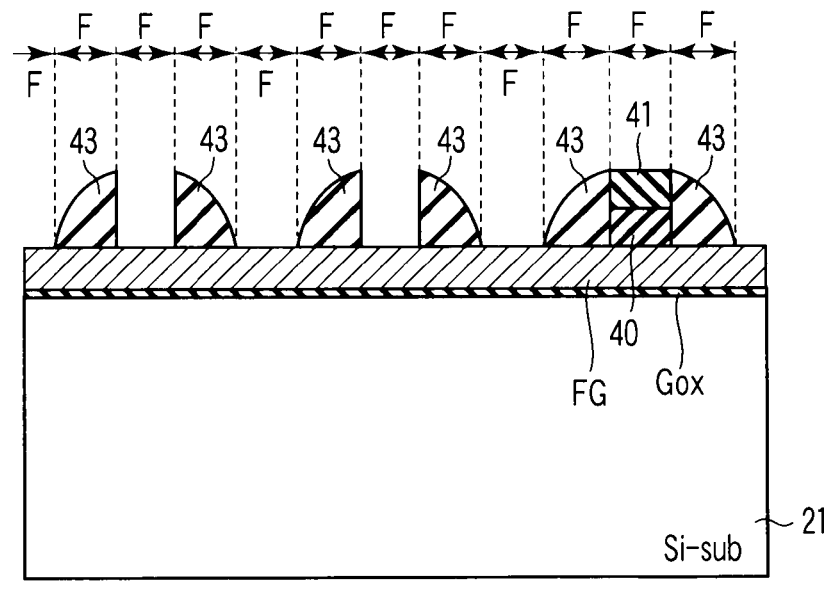
FIG. 13B is a cross-sectional view illustrating a fabrication step of the semiconductor memory device according to the first embodiment.

As shown in FIG. 13, FIG. 13A and FIG. 13B, the mask materials 40 and 41, which become the active area AA, are selectively removed, and a mask pattern having a loop configuration, in which the mask members 43 that are the side walls are left, is formed. Those portions of the mask materials that become dummy active areas are not removed. As a result, the width of the dummy AA in the WL direction is equal to the width of the loop-shaped active area in the WL direction.

Figure 14A:
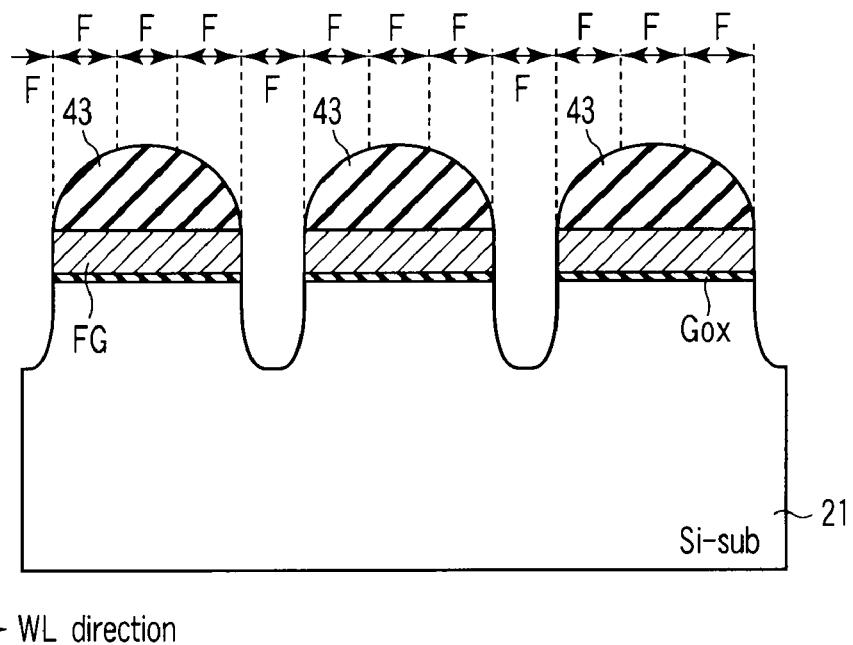
FIG. 14A is a cross-sectional view illustrating a fabrication step of the semiconductor memory device according to the first embodiment.
Figure 14B:
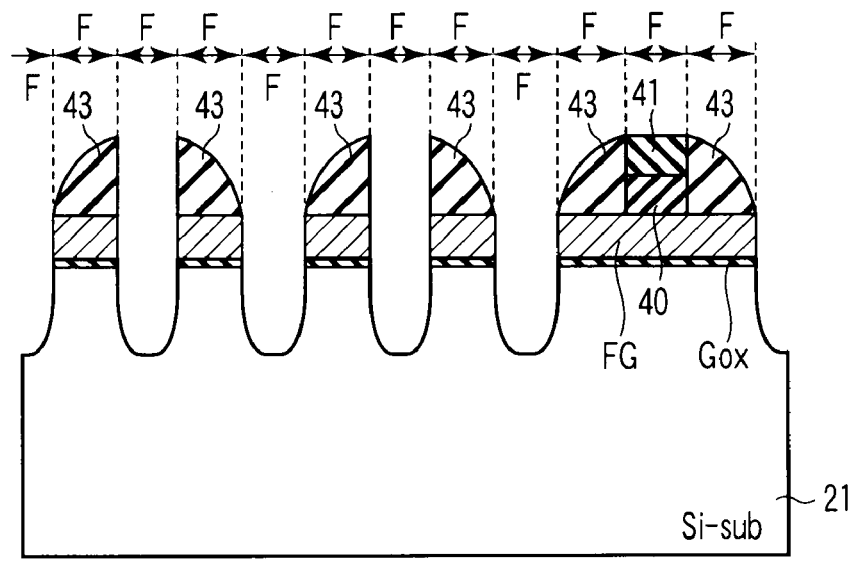
FIG. 14B is a cross-sectional view illustrating a fabrication step of the semiconductor memory device according to the first embodiment.

Subsequently, as shown in FIG. 14A and FIG. 14B, using the mask pattern including the loop configuration as a mask, anisotropic etching such as RIE is performed, and trenches, which penetrate the floating electrode FG and tunnel insulation film Gox, are formed in the silicon substrate 21.

Figure 15A:
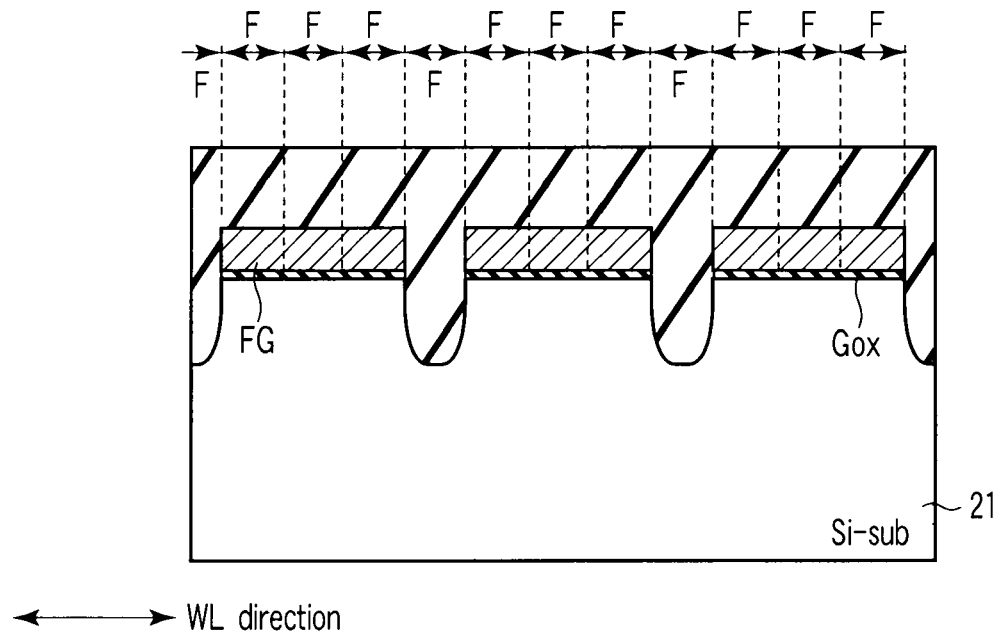
FIG. 15A is a cross-sectional view illustrating a fabrication step of the semiconductor memory device according to the first embodiment.
Figure 15B:
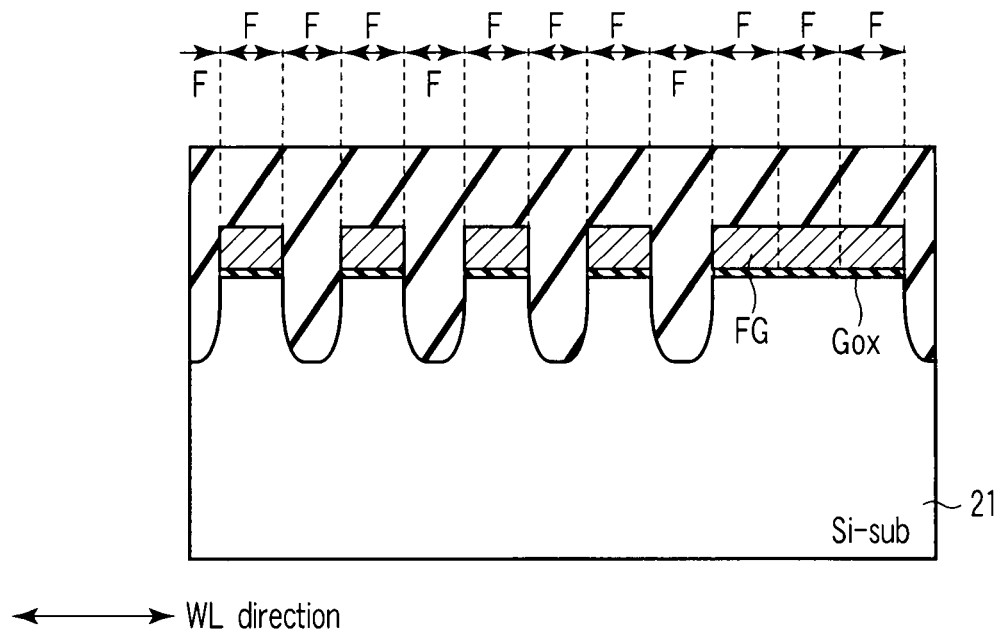
FIG. 15B is a cross-sectional view illustrating a fabrication step of the semiconductor memory device according to the first embodiment.

As shown in FIG. 15A and FIG. 15B, the mask members 40, 41 and 43 in the memory cell array 11 are removed. Then, a silicon oxide film, for instance, is buried in the trenches by, e.g. CVD.

Figure 16A:
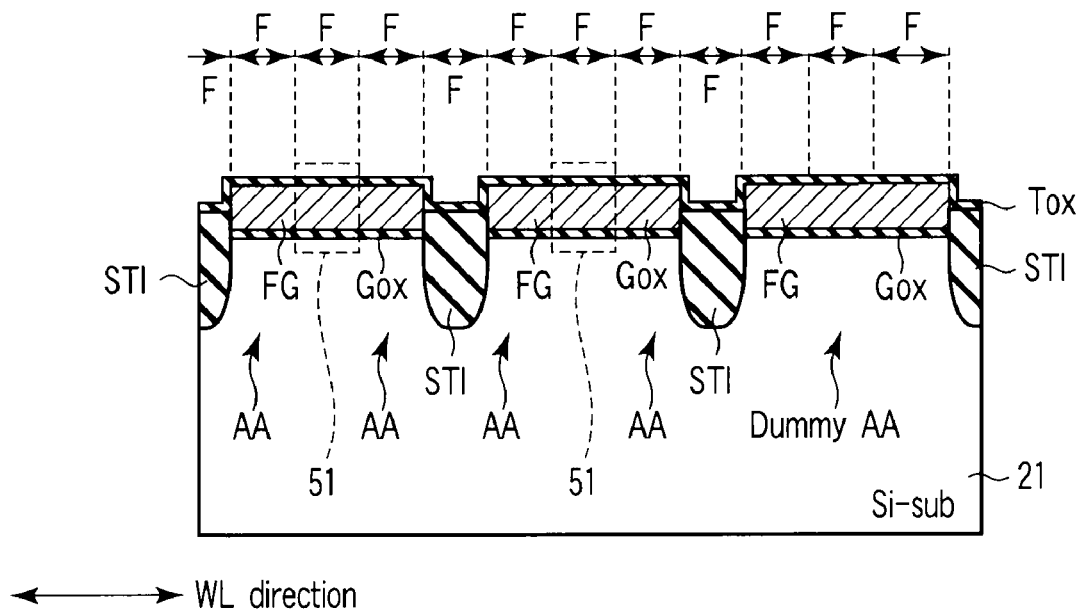
FIG. 16A is a cross-sectional view illustrating a fabrication step of the semiconductor memory device according to the first embodiment.
Figure 16B:
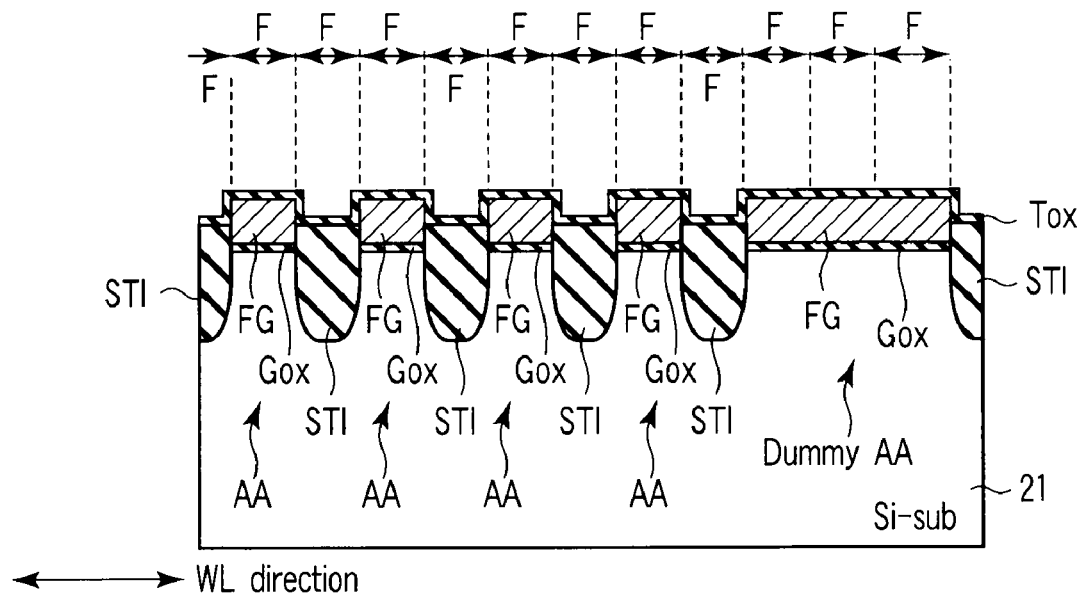
FIG. 16B is a cross-sectional view illustrating a fabrication step of the semiconductor memory device according to the first embodiment.

As shown in FIG. 16A and FIG. 16B, anisotropic etching, such as RIE, is performed in such a manner that the upper surface of the silicon oxide film becomes not higher than the upper surface of the floating electrode FG. As a result, the silicon oxide film is left in the trenches, and thus device isolation insulation films STI are formed. Then, a silicon oxide film or an oxynitride film is deposited on the floating electrode FG by, e.g. CVD, and an inter-gate insulation film Tox is formed. Other usable materials of the inter-gate insulation film Tox include an ONO (oxide/nitride/oxide) film comprising a silicon oxide film, a silicon nitride film and a silicon oxide film, an NONON film in which an ONO structure is interposed between silicon nitride films, and a film including a high-dielectric-constant material such as an $Al_2O_3$ film, an HfAlO film or an HfSiOx film.

Subsequently, that portion of the insulation film, which corresponds to a central part of the select transistor S1, S2, is selectively opened, and an inter-gate insulation film IPD is formed.

Thereafter, using well-known fabrication steps, a control electrode CG, an interlayer insulation film 27-1, 27-2, a bit line contact BC, a source line contact SC, bit lines BL and source lines SL are formed, and the semiconductor memory device shown in FIG. 1 to FIG. 7 is manufactured.

<7. Advantageous Effects of the Present Embodiment>

According to the semiconductor memory device and the manufacturing method relating to the present embodiment, at least the following advantageous effects (1) to (5) can be obtained.

(1) Dust defects due to tapering or cracking in an isolated pattern of the active area can be prevented.

As has been described above, the memory cell array 11 of the semiconductor memory device according to the present embodiment includes the first extension portion 51 which is provided between one-side terminal end portions of two active areas AA neighboring in the word line (WL) direction, and the second extension portion 52 which is provided between the other-side terminal end portions of the two active areas AA. The first extension portion 51 and second extension portion 52 connect the two neighboring active areas AA in a loop shape.

Thus, when the active areas AA are to be formed on the semiconductor substrate 21, the respective active areas AA are not formed in line-shaped isolated patterns, but two active areas AA neighboring in the WL direction are formed in the loop configuration in which the two active areas AA are connected in the loop shape.

Accordingly, it is possible to prevent occurrence of "tapering" or "cracking" at the one-side terminal end portions and the other-side terminal end portions of the active areas AA, and to prevent consequent occurrence of dust. As a result, it becomes possible to prevent a dust defect due to the dust that is caused by the tapering or cracking in isolated patterns of active areas. Moreover, since the dust defect can be prevented, the manufacturing yield can advantageously be improved.

(2) The manufacturing cost can advantageously be reduced.

The mask pattern of the loop configuration is formed by leaving the mask members 43 on the side walls of the mask members 40 and 41 in a self-alignment manner. Accordingly, the patterning of the active areas AA, the first extension portion 51 and the second extension portion 52 can be performed at a time.

As a result, since there is no need to separately pattern the first extension portion 51 and the second extension portion 52, the manufacturing cost can advantageously be reduced.

(3) A large margin can be secured at the time of forming the active areas AA.

As shown in FIG. 13, FIG. 13A and FIG. 13B, the mask pattern of the loop configuration corresponding to the active areas AA is formed so as to have the same line width (F) and the same space (F). Therefore, a large margin can be secured at the time of forming the active areas AA.

(4) Microfabrication can advantageously be achieved.

The width of the mask member 43 in the WL direction, which is left on the mask members 40 and 41, can be made less than the minimum feature size F by further continuing the anisotropic etching such as RIE. Accordingly, the width of the mask member 43 can be made less than the minimum feature size F that is determined by an ordinary PEP (photo-engraving process).

As a result, very narrow patterning of the active area AA can be made and the line width can be made less than the minimum feature size F, by etching the floating electrode FG and tunnel insulation film Tox with use of the mask of the loop-configuration mask pattern. In this respect, microfabrication can advantageously be achieved.

(5) The dummy active areas can be formed simultaneous with the active areas.

A plurality of active areas AA having the minimum feature size F in the word line direction, and dummy active areas having a width of about 3F in the word line direction and located outside the active areas AA can be formed simultaneously. As a result, the process margin at the boundary between the memory cell arrays 11 can be improved.

Second Embodiment

An Example in which all One-Side Terminal End Portions and all Other-Side Terminal End Portions are Connected Next, a semiconductor memory device according to a second embodiment of the present invention is described with reference to FIG. 17 to FIG. 19. A detailed description of the parts common to those in the first embodiment is omitted here.

Figure 17:
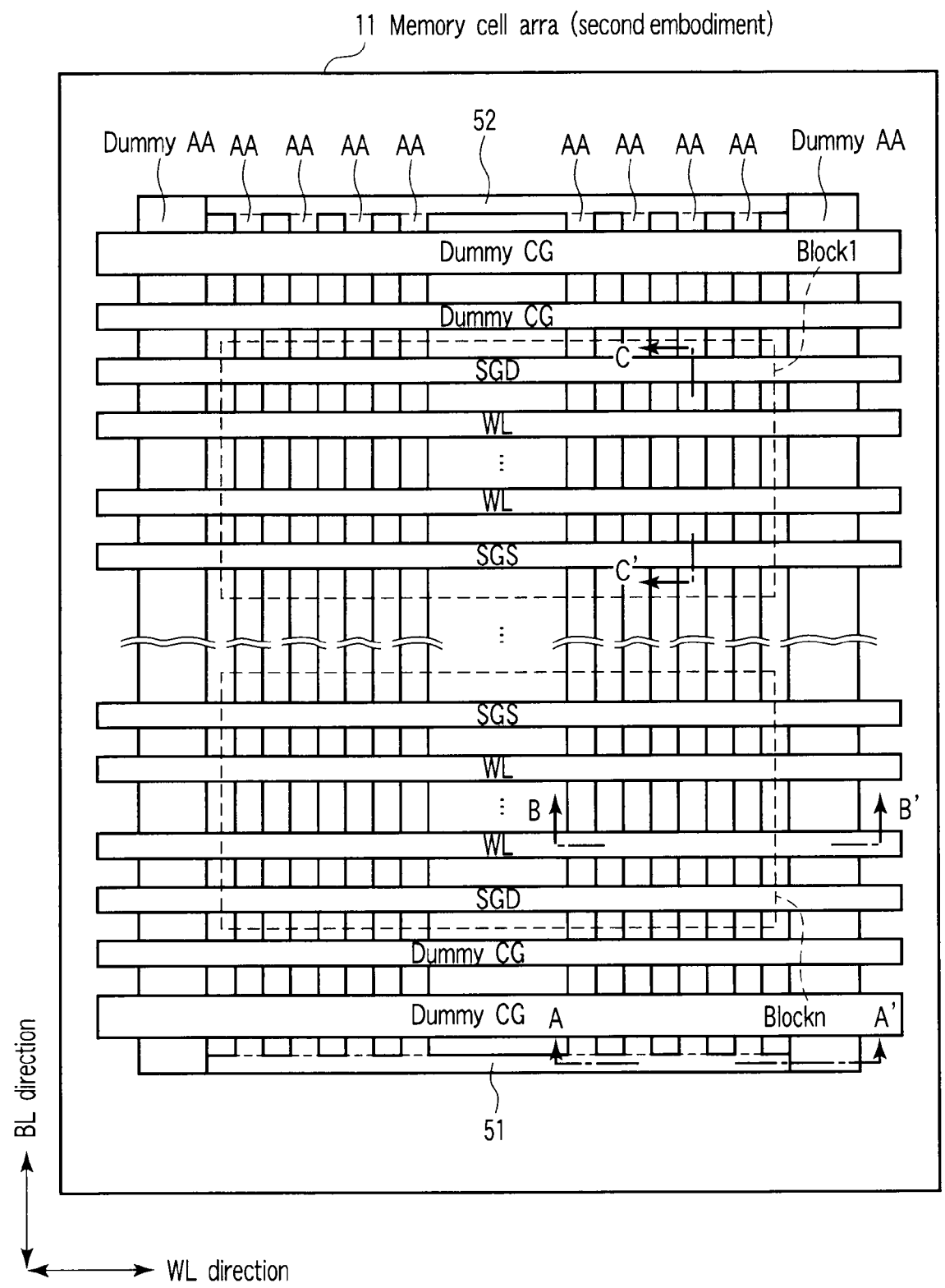
FIG. 17 is a plan view showing a semiconductor memory device according to a second embodiment of the present invention.
Figure 18:
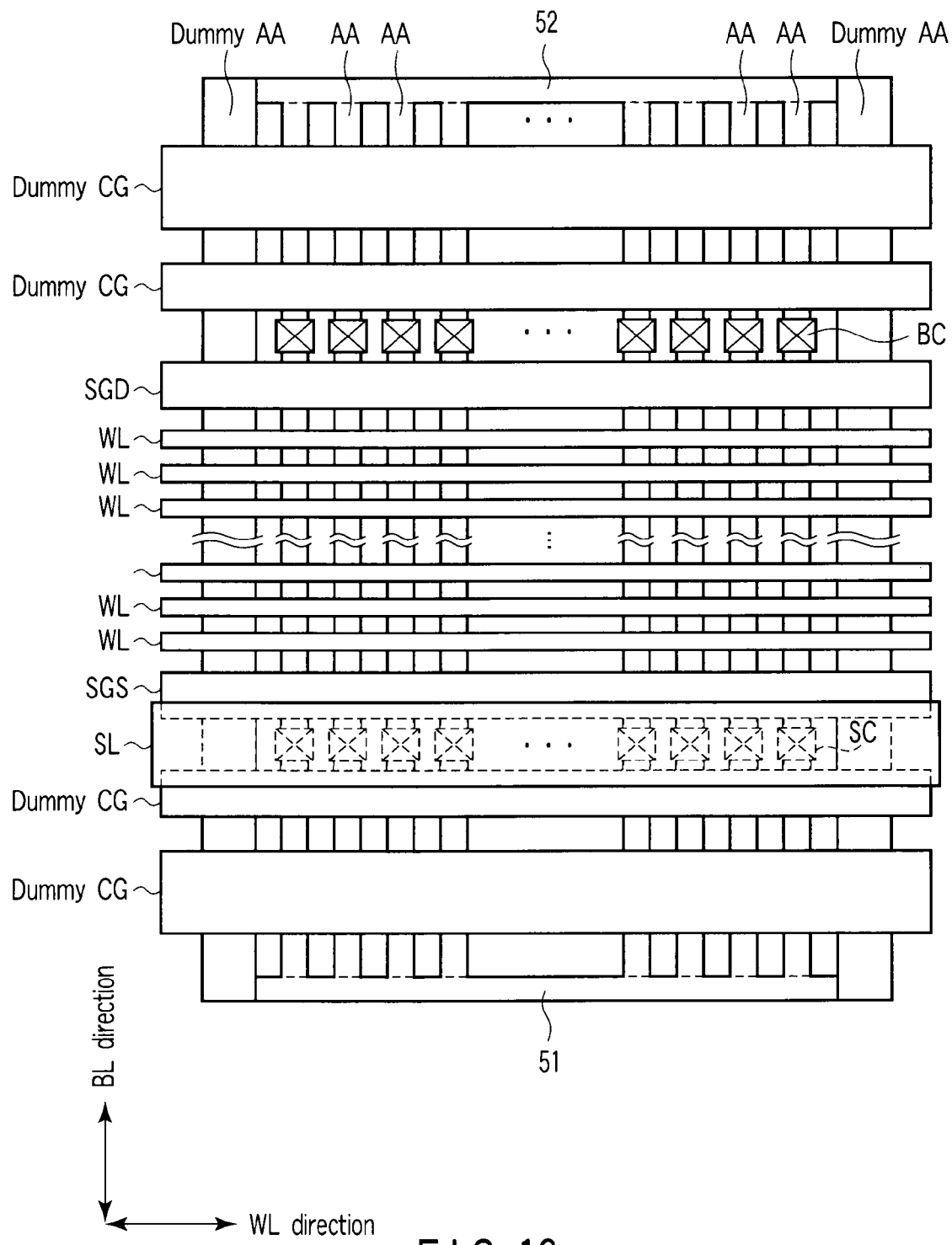
FIG. 18 is a plan view showing the semiconductor memory device according to the second embodiment.

As shown in FIG. 17 to FIG. 19, the memory cell array 11 according to the second embodiment differs from the memory cell array 11 according to the first embodiment in that a first extension portion 51 and a second extension portion 52 are provided in the WL direction so as to connect one-side terminal end portions and the other-side terminal end portions of all active areas AA in the memory cell array 11 and in that those end portions of the first and second extension portions 51 and 52 in the WL direction are touched with the dummy AA. In the other respects, the cross-sectional structure in the second embodiment is the same as that in the first embodiment.

The manufacturing method in the second embodiment is similar to that in the first embodiment with respect to the process shown in FIGS. 13A to 13C, but differs from that in the first embodiment with respect to the following points.

Figure 20:
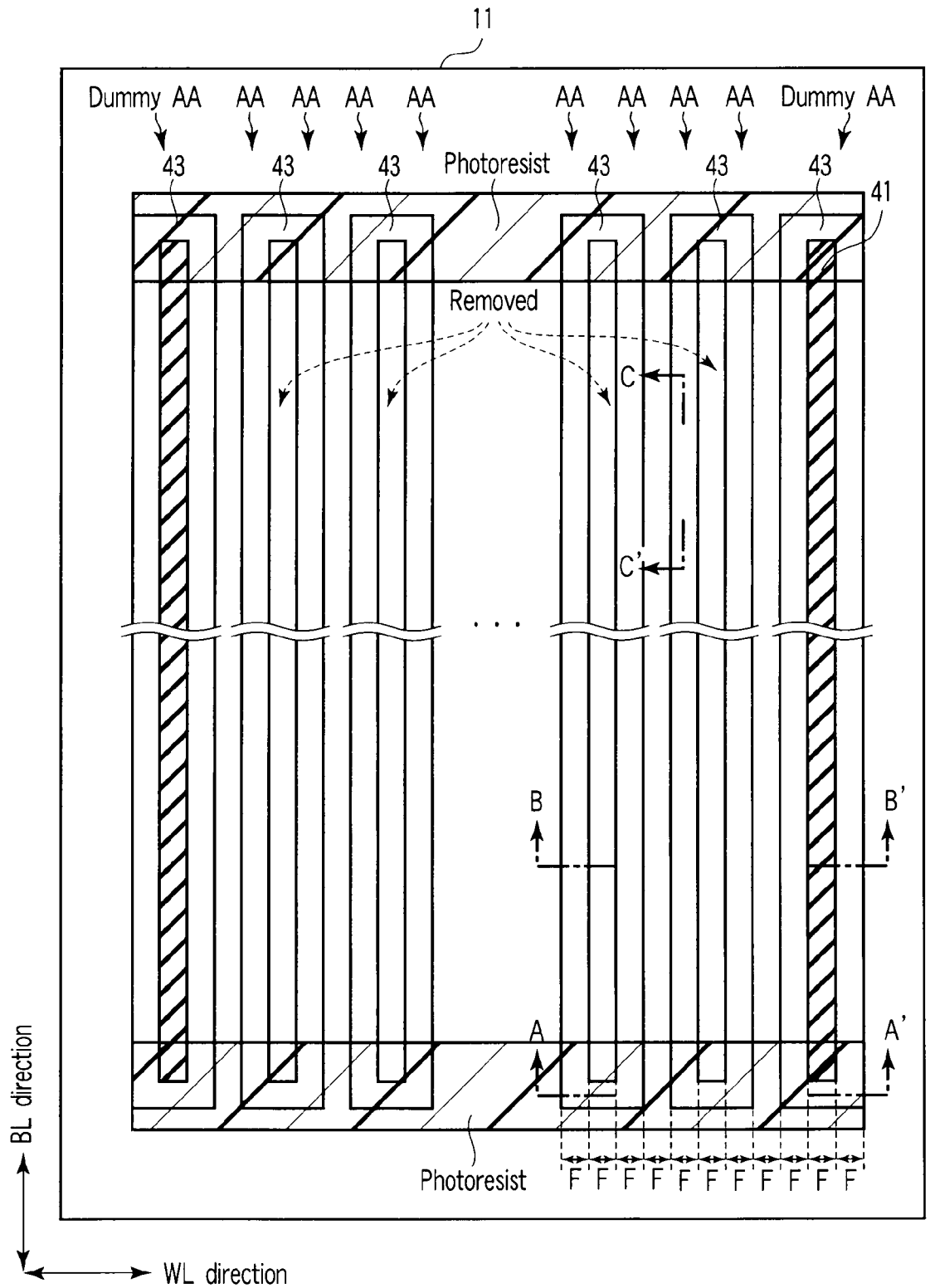
FIG. 20 is a plan view illustrating a fabrication step of the semiconductor memory device according to the second embodiment of the present invention.

As shown in FIG. 20, the end portions of the loop-shaped mask pattern BL in the BL direction are covered with photoresist in the WL direction. After the steps shown in FIG. 14 to FIG. 14Z are executed, the photoresist is removed. The subsequent steps are similar to those of the first embodiment.

As a result, first and second extension portions 51 and 52 can be formed to extend in the WL direction so as to connect one-side terminal end portions and the other-side terminal end portions of all active areas AA in the memory cell array 11.

According to the semiconductor memory device and the manufacturing method relating to the present embodiment, at least the same advantageous effects (1) to (5) as described above and further advantageous effect (6) can be obtained.

Specifically, with the advantageous effect (1), even when the active areas AA are to be formed on the semiconductor substrate 21, the respective active areas AA are not formed in line-shaped isolated patterns, but are formed with the pattern in which one-side terminal end portions and the other-side terminal end portions of all active areas AA are connected in the WL direction.

Thus, it is possible to prevent occurrence of "tapering" or "cracking" at the one-side terminal end portions and the other-side terminal end portions of the active areas AA, and to prevent consequent occurrence of dust.

(6) Since those end portions of the first and second extension portions 51 and 52 are touched with the dummy AA, "tapering" and "cracking" are prevented at the end portions of the first and second extension portions 51 and 52.

The structure and manufacturing method as in the present embodiment are applicable, where necessary.

Third Embodiment

Another Example of First and Second Extension Portions

Next, a semiconductor memory device according to a third embodiment of the invention is described with reference to FIG. 21 to FIG. 25. The third embodiment relates to another example of the first and second extension portions. A detailed description of the parts common to those in the first embodiment is omitted here.

Figure 21:
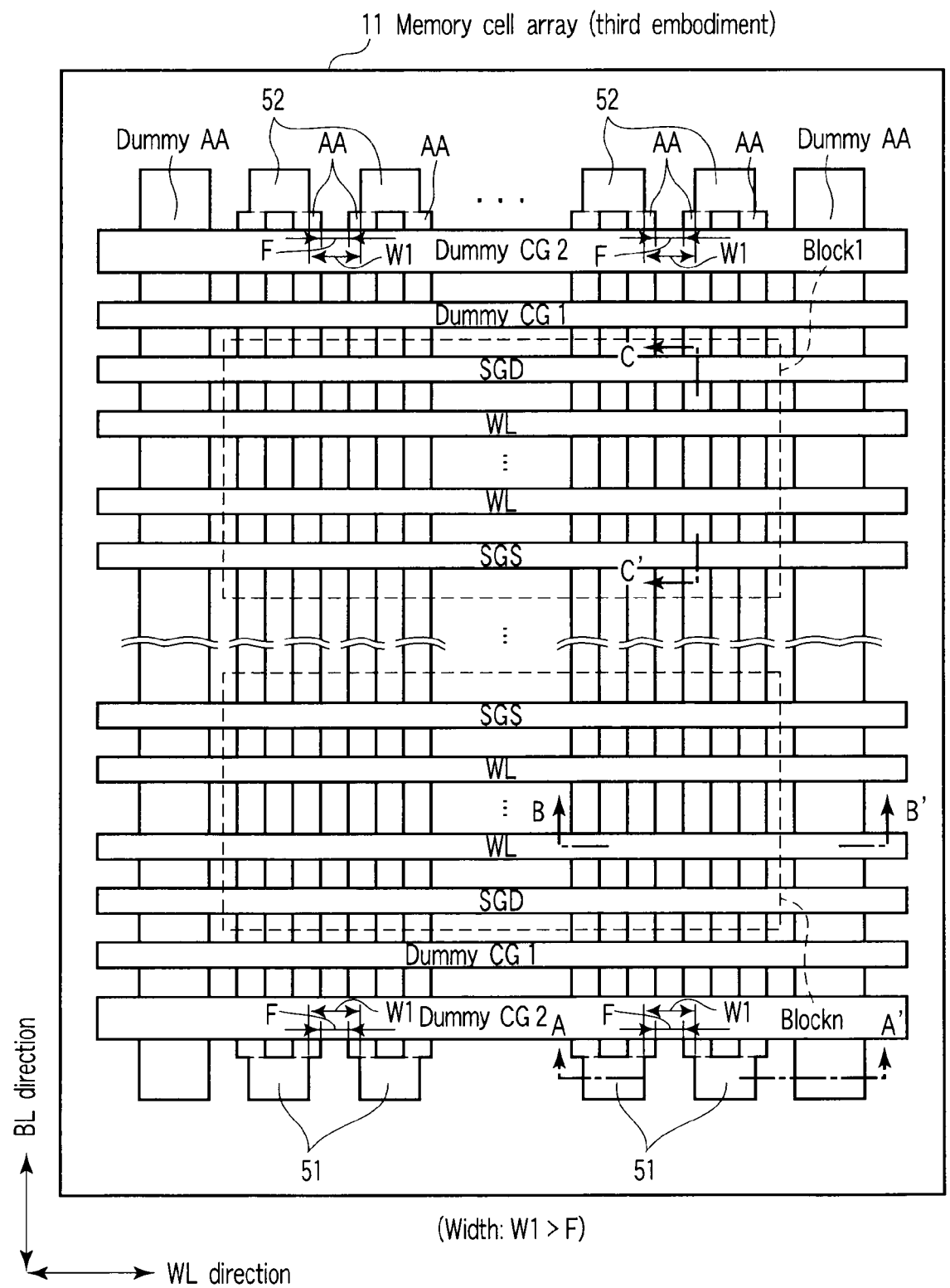
FIG. 21 is a plan view showing a semiconductor memory device according to a third embodiment of the present invention.
Figure 22:
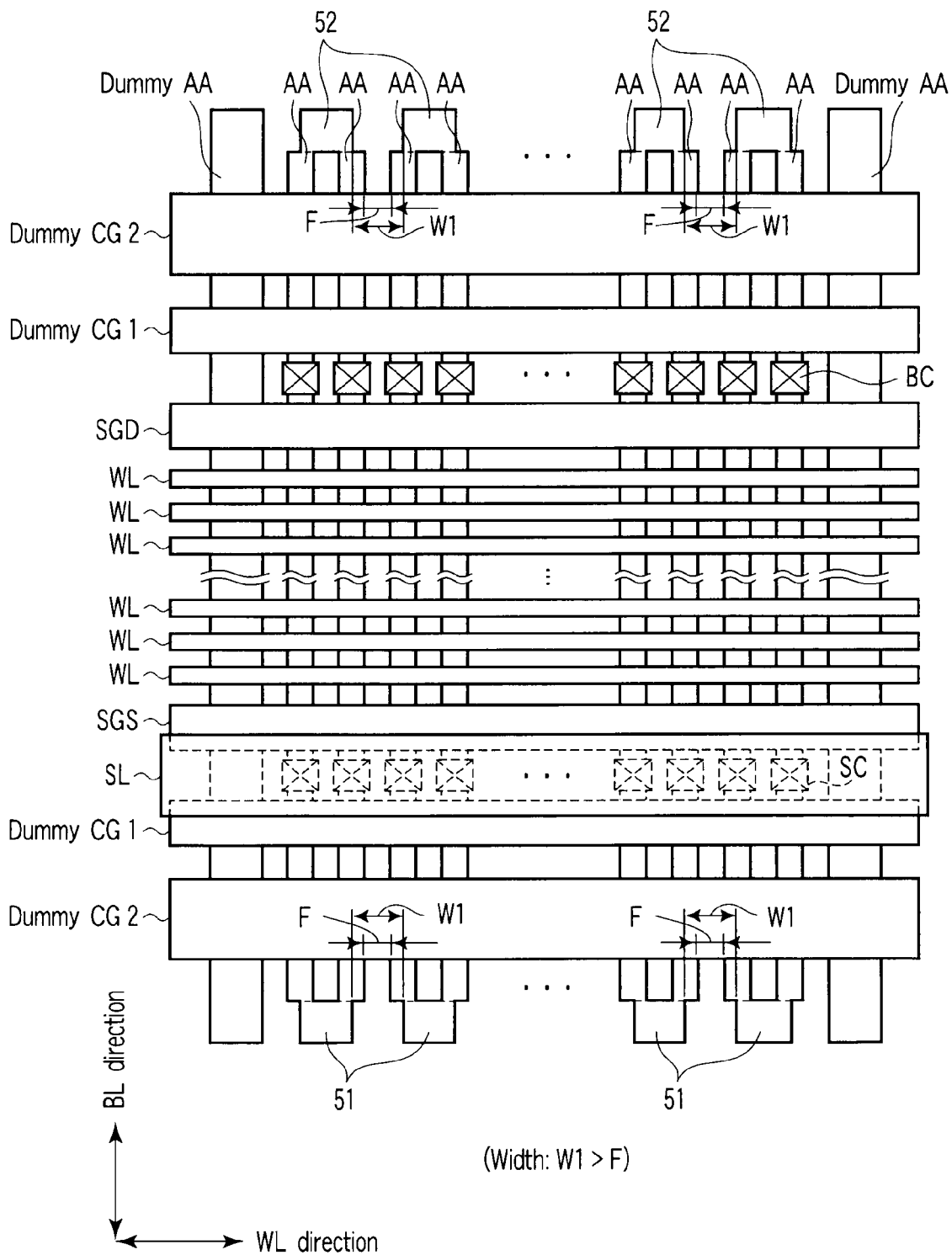
FIG. 22 is a plan view showing the semiconductor memory device according to the third embodiment.

As shown in FIG. 20 and FIG. 21, the third embodiment differs from the first embodiment in that a first extension portion 51 and a second extension portion 52 are provided so as to connect two active areas AA, which neighbor in the BL direction, in a loop shape, and an interval W1 in the WL direction between the first extension portions 51 and between the second extension portions 52 is set to be greater than the minimum feature size F that is the interval between the active areas AA. In other words, compared to the first and second embodiments, the first extension portion 51 and second extension portion 52 are formed in a finer shape.

The manufacturing method in the third embodiment is similar to that in the first embodiment with respect to the process shown in FIGS. 10A to 10C, but differs from that in the first embodiment in the following respects.

Figure 23:
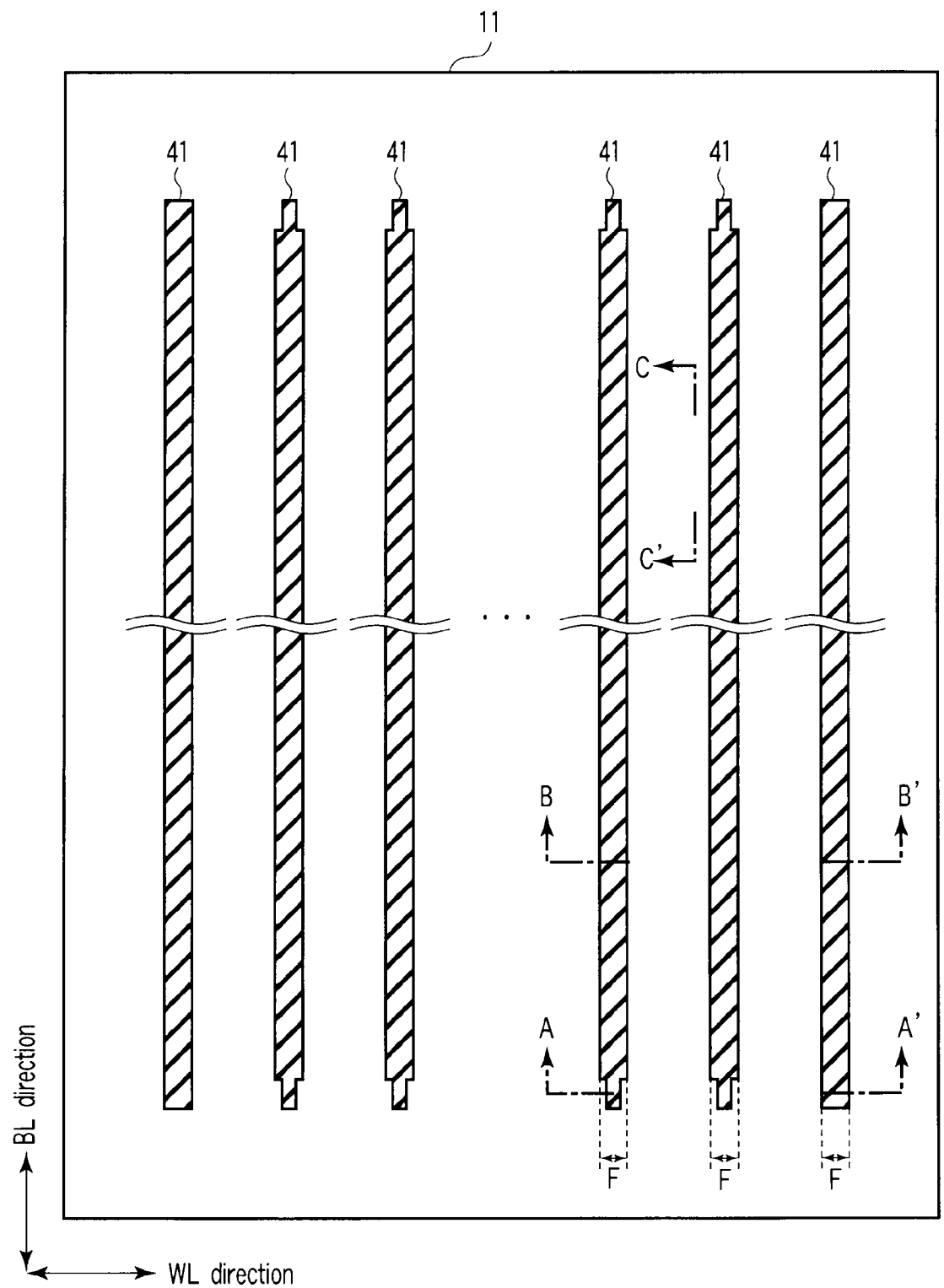
FIG. 23 is a plan view illustrating a fabrication step of the semiconductor memory device according to the third embodiment of the present invention.

As shown in FIG. 23, the mask member 41 is processed to have a thin end portion. The shape of the thin end portion can be changed by changing the shape of the photomask used in photolithography. Where the mask member 41 is used, the process conditions may be determined when the process using RIE is executed.

Figure 25:
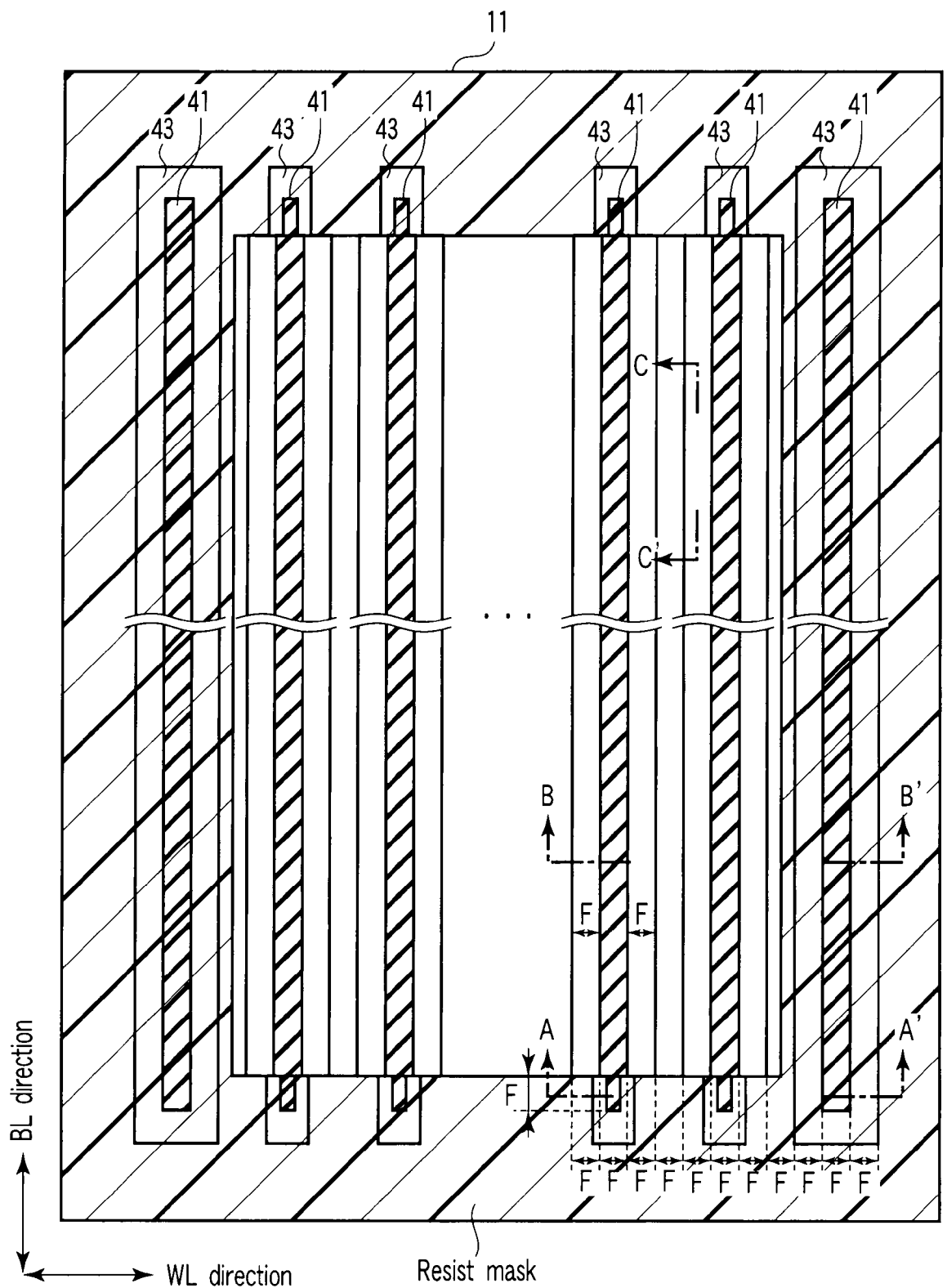
FIG. 25 is a plan view illustrating a fabrication step of the semiconductor memory device according to the third embodiment of the present invention.

Steps similar to those shown in FIG. 12 of the first embodiment are executed. As a result, the planar shape corresponding to FIG. 12 is like that shown in FIG. 24. As shown in FIG. 25, photoresist is provided in such a manner as to cover the thin end portion of the mask member 41. Steps similar to those shown in FIG. 13 of the first embodiment are executed.

Figure 26:
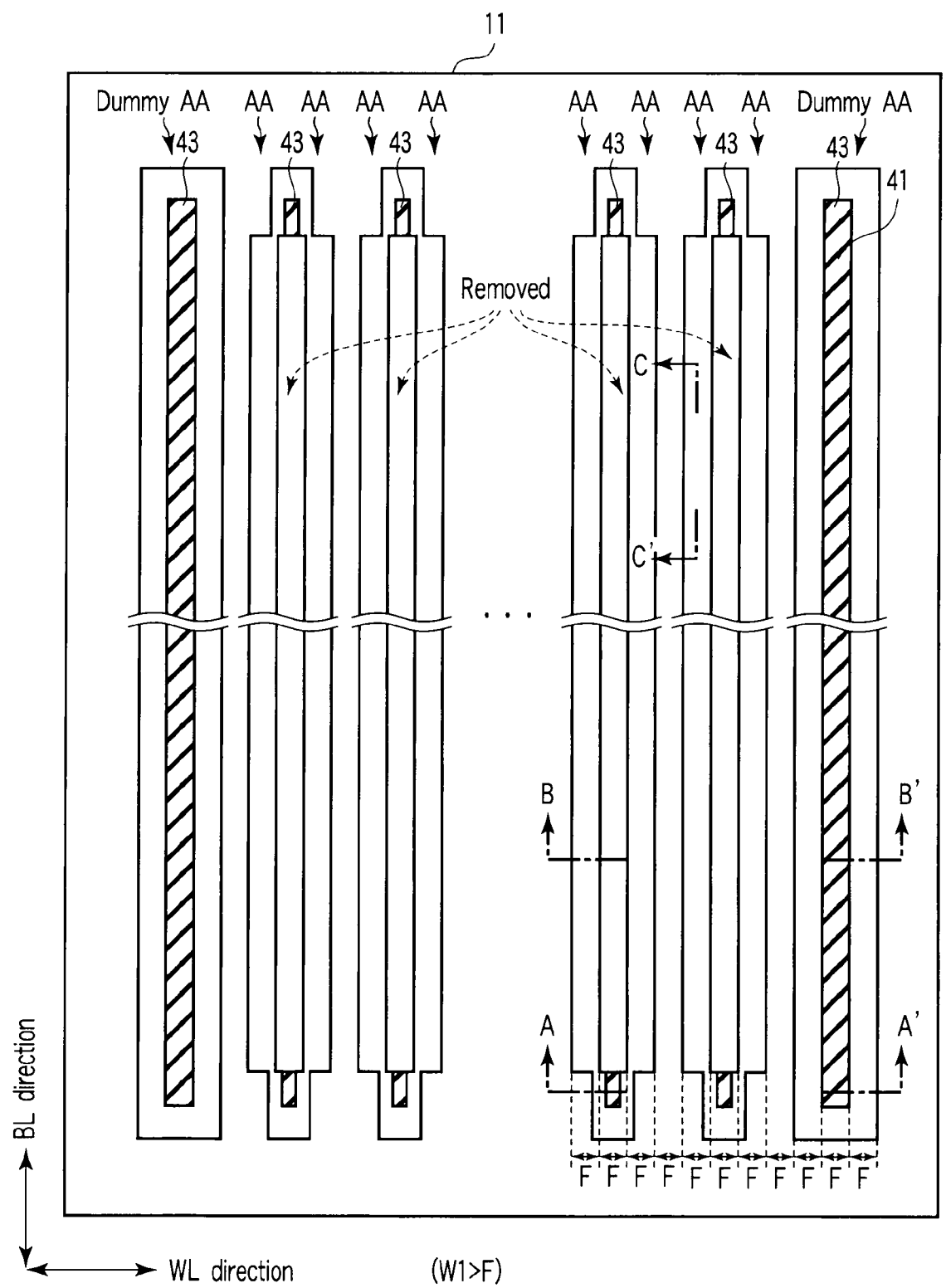
FIG. 26 is a plan view illustrating a fabrication step of the semiconductor memory device according to the third embodiment of the present invention.

As a result, as shown in FIG. 26, the planar shape corresponding to FIG. 13 is a shape wherein interval W1 in the WL direction is greater than the minimum feature size F (which is an interval in the active areas AA). The subsequent steps are similar to those of the first embodiment.

As a result, the first and second extension portions 51 and 52 are formed in such a manner that two active areas adjacent in the BL direction are connected to form a loop and interval W1 in the WL direction is greater than the minimum feature size F (which is an interval in the active areas AA).

According to the semiconductor memory device and the manufacturing method relating to the present embodiment, at least the same advantageous effects (1) and (2) as described above can be obtained.

Furthermore, the first extension portion 51 and the second extension portion 52 are provided so as to connect two active areas AA, which neighbor in the BL direction, in a loop shape, and the interval W1 in the WL direction between the first extension portions 51 and between the second extension portions 52 is set to be greater than the interval F between the active areas AA. In other words, compared to the first and second embodiments, the first extension portion 51 and second extension portion 52 are formed in a finer shape.

Thus, when the photoresist is exposed and developed, it is possible to avoid an extreme decrease in light intensity of photolithography in the vicinity of the first extension portion 51 and second extension portion 52. Therefore, a common margin between the first and second extension portions 51 and 52 and the active areas AA can advantageously be secured.

The structure and manufacturing method of the present embodiment are applicable, where necessary. [Modification (an example in which the space width between active areas AA is cyclically varied with a large width ($F_L$), a small width ($F_S$), a large width ($F_L$), ... )]

Next, a semiconductor memory device according to a modification of the invention is described with reference to FIG. 27. The modification relates to an example in which the space width in the WL direction on the inside and the outside of the loop configuration is cyclically varied with a large width ($F_L$), a small width ($F_S$), a large width ($F_L$), a small width ($F_S$) .... A detailed description of the parts common to those in the first embodiment is omitted here.

As shown in FIG. 27, a first space width $F_L$ in the WL direction within the loop configuration and a second space width $F_S$ in the WL direction outside the loop configuration between neighboring active areas AA are different from the corresponding space widths in the first embodiment with respect to the following points. Specifically, a pattern in which the first space width $F_L$ becomes greater than the second space width $F_S$ is repeated (a large width ($F_L$), a small width ($F_S$), a large width ($F_L$), a small width ($F_S$) ... ).

On the other hand, like the first embodiment, the line widths of the active area AA, first extension portion 51 and second extension portion 52 are substantially equal and set at about the minimum feature size F. In addition, the pitch P of the active areas AA in the WL direction is equal to that in the first embodiment.

Next, the method of manufacturing the semiconductor memory device according to the modification is described with reference to FIG. 28 and FIG. 29.

Using the same fabrication steps as described above, a tunnel insulation film Gox and a floating electrode FG are successively formed on a P-well that is formed in the semiconductor substrate 21.

Then, as shown in FIG. 28, mask members 40 and 41 (cores) are successively formed on the floating electrode FG by, e.g. CVD, in the BL direction. In this fabrication step, the line width of the mask member 40, 41 in the WL direction becomes $F_L$ which is greater than the minimum feature size F ($F_L$>F). The fact that the line width of the mask member 40, 41 in the WL direction becomes $F_L$ which is greater than the minimum feature size F is due to non-uniformity in the formation of the mask member 40, 41 (core).

Figure 29:
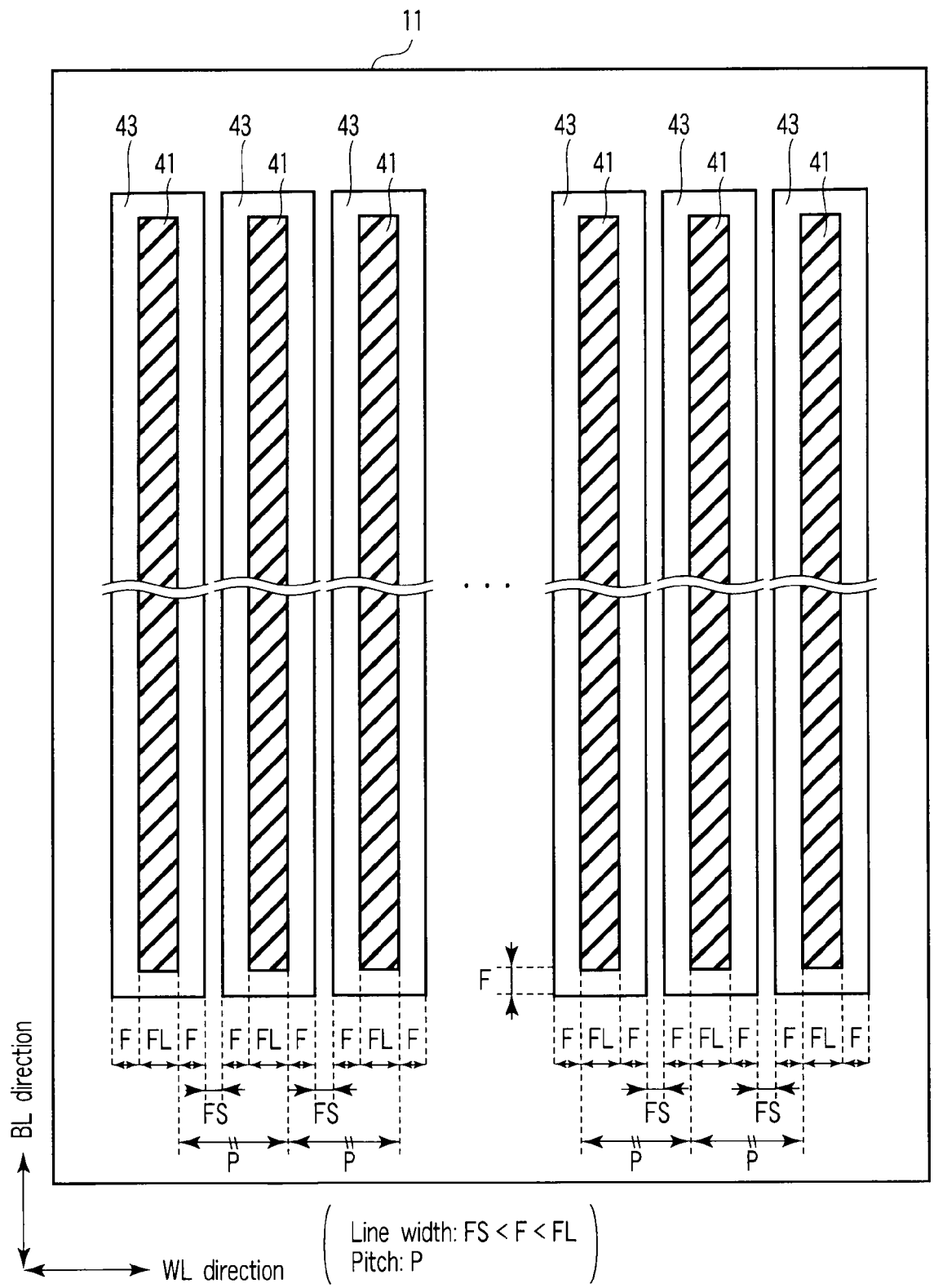
FIG. 29 is a plan view illustrating a fabrication step of the semiconductor memory device according to the modification.

Subsequently, as shown in FIG. 29, a mask member 43, which completely covers the mask member 40, 41, is formed on the mask member 40, 41. The mask member 43 is left only on side walls of the mask member 40, 41 in a self-alignment manner. At this time, the size of the mask member 43 in the WL direction, which is formed on the side walls of the mask member 40, 41, is set at about the minimum feature size F, in like manner as described above.

In the above fabrication step, the pitch P of the mask member 40, 41 in the WL direction is also set in like manner as in the first embodiment. Thus, the space width $F_S$ between the active areas AA is less than the size F of each active area AA in the WL direction ($F_S$<F).

Thereafter, using the same fabrication steps as in the first embodiment, the semiconductor memory device shown in FIG. 27 is manufactured.

According to the semiconductor memory device and the manufacturing method relating to the present modification, at least the same advantageous effects (1) to (4) as described above can be obtained. The structure and manufacturing method as in the present modification are applicable, where necessary.

In the present modification, the pattern arrangement of the first space width $F_L$ in the WL direction within the loop configuration and the second space width $F_S$ in the WL direction outside the loop configuration between neighboring active areas AA is repeated with the first space width $F_L$ being greater than the second space width $F_S$ (large width ($F_L$), small width ($F_S$), large width ($F_L$), small width ($F_S$) . . . ).

However, for the same reason as described above, the following case is thinkable: the pattern arrangement of the first space width in the WL direction within the loop configuration and the second space width in the WL direction outside the loop configuration between neighboring active areas AA is repeated with the first space width being less than the second space width (small width, large width, small width, large width . . . ).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of active areas each extending in a first direction and including a memory cell string which includes select transistors and memory cells, current paths of which are connected in series;
a first extension portion which is provided between one-side terminal end portions of two said active areas neighboring in a second direction that crosses the first direction; and
a second extension portion which is provided between other-side terminal end portions of two said active areas neighboring in the second direction, the first and second extension portions connecting the two active areas in a loop configuration,
wherein a pattern arrangement of a first space width in the second direction within the loop configuration and a second space width in the second direction outside the loop configuration between neighboring said active areas is repeated with the first space width being greater than the second space width, or with the first space width being less than the second space width.

2. The device according to claim 1, wherein a line width of each of the plurality of active areas in the second direction is equal to a line width of each of the first extension portion and the second extension portion in the first direction.

3. The device according to claim 1, wherein each of the plurality of active areas includes a bit line contact which is electrically connected to one end of the current path of the memory cell string, and a source line contact which is electrically connected to the other end of the current path of the memory cell string.

4. The device according to claim 3, wherein a dummy transistor is formed between the bit line contact and the first extension portion.

5. The device according to claim 4, wherein the dummy transistor is kept OFF.

6. The device according to claim 4, wherein a dummy transistor is formed between the source line contact and the second extension portion.

7. The device according to claim 1, further comprising a dummy active area which is disposed along the first direction and has a line width in the second direction which is greater than a line width of the active area.

8. The device according to claim 7, wherein the dummy active area is a sum of the width of a given active area and a value twice that of the width of the active areas adjacent to that given active area.

9. A semiconductor memory device comprising:
a plurality of loop-shaped active areas arranged in a first direction at predetermined intervals; and
a dummy active area arranged to surround the active areas, a width of the dummy active area as defined in the first direction being equal to a width of the loop-shaped active areas as defined in the first direction,
wherein the loop-shaped active area includes a first active area and a second active area are provided to extend in a second direction perpendicular to the first direction, each of the first and second active areas comprising memory cell string which includes select transistors and memory cells, current paths of which are connected in series, a first extension portion which is provided in such a manner as to connect one-side end portions of the first and second active areas in the first direction, and a second extension portion which is provided in such a manner as to connect other-side end portions of the first and second active areas in the first direction.

10. The device according to claim 9, wherein a line width of each of the plurality of active areas in the second direction is equal to a line width of each of the first extension portion and the second extension portion in the first direction.

11. The device according to claim 9, wherein each of the first and second active areas includes a bit line contact which is electrically connected to one end of the current path of the memory cell string, and a source line contact which is electrically connected to the other end of the current path of the memory cell string.

12. The device according to claim 9, wherein a first space width in the first direction between the first active area and the second active area; and a second space width in the first direction between neighboring said the loop-shaped active areas;

the first space width and the second space width is repeated with the first space width being greater than the second space width, or with the first space width being less than the second space width.

13. The device according to claim 9, wherein adjacent the loop-shaped active areas are connected together by the first extension portion.

14. The device according to claim 13, wherein the loop-shaped active areas and the dummy active area are connected together by the first extension portion.

15. The device according to claim 9, wherein spaces of the adjacent the loop-shaped active areas are determined such that the space of the first extension portion is greater than the space between the first and second active areas.

16. The device according to claim 11, wherein a dummy transistor is formed between the bit line contact and the first extension portion.

17. The device according to claim 16, wherein the dummy transistor is kept off.

18. The device according to claim 16, wherein a dummy transistor is formed between the source line contact and the second extension portion.

19. The device according to claim 9, wherein the dummy active area is disposed along the first direction and has a line width in the second direction which is greater than a line width of the active area.

20. The device according to claim 19, wherein the dummy active area is a sum of the width of a given active area and a value twice that of the width of the active areas adjacent to that given active area.

* * * * *